United States Patent
Baeck et al.

(10) Patent No.: US 10,192,957 B2
(45) Date of Patent: Jan. 29, 2019

(54) THIN-FILM TRANSISTOR ARRAY SUBSTRATE

(71) Applicant: LG DISPLAY CO., LTD., Seoul (KR)

(72) Inventors: Juheyuck Baeck, Seoul (KR); Jonguk Bae, Seoul (KR); Saeroonter Oh, Seoul (KR); Dohyung Lee, Seoul (KR); Taeuk Park, Daejeon (KR)

(73) Assignee: LG DISPLAY CO., LTD., Seoul (KR)

( * ) Notice: Subject to any disclaimer, the term of this patent is extended or adjusted under 35 U.S.C. 154(b) by 0 days.

(21) Appl. No.: 15/531,952

(22) PCT Filed: Dec. 16, 2015

(86) PCT No.: PCT/KR2015/013802
§ 371 (c)(1),
(2) Date: May 31, 2017

(87) PCT Pub. No.: WO2016/099150
PCT Pub. Date: Jun. 23, 2016

(65) Prior Publication Data
US 2017/0330938 A1    Nov. 16, 2017

(30) Foreign Application Priority Data

Dec. 16, 2014  (KR) .................. 10-2014-0181296
Dec. 16, 2015  (KR) .................. 10-2015-0179783

(51) Int. Cl.
*H01L 29/10*  (2006.01)
*H01L 27/12*  (2006.01)
(Continued)

(52) U.S. Cl.
CPC ...... *H01L 29/1054* (2013.01); *H01L 27/1225* (2013.01); *H01L 29/41775* (2013.01);
(Continued)

(58) Field of Classification Search
CPC ........ H01L 27/1251; H01L 27/3244–27/3297; H01L 29/4908; H01L 51/0508–51/0533;
(Continued)

(56) References Cited

U.S. PATENT DOCUMENTS

2003/0052348 A1    3/2003  Takagi
2012/0313079 A1   12/2012  Song
(Continued)

FOREIGN PATENT DOCUMENTS

JP    2013084940 A    5/2013
JP    2013149965 A    8/2013
(Continued)

*Primary Examiner* — Cuong B Nguyen
(74) *Attorney, Agent, or Firm* — Dentons US LLP

(57) ABSTRACT a thin-film transistor according to an exemplary embodiment of the present invention comprises an active layer; an intermediate layer; a gate insulating film; a gate electrode; an interlayer insulating film; and source and drain electrodes. The active layer is positioned on a substrate, and the gate insulating film is positioned on the active layer. The gate electrode is positioned on the gate insulating film, and the interlayer insulating film is positioned on the gate electrode. The source and drain electrodes are positioned on the interlayer insulating film and connected to the active layer. The intermediate layer is positioned between the active layer and the gate insulating film, and made of an oxide semiconductor comprising a Group IV element.

8 Claims, 31 Drawing Sheets

(51) Int. Cl.
*H01L 29/417* (2006.01)
*H01L 29/66* (2006.01)
*H01L 29/786* (2006.01)
*H01L 29/49* (2006.01)

(52) U.S. Cl.
CPC .... *H01L 29/4908* (2013.01); *H01L 29/66969* (2013.01); *H01L 29/7869* (2013.01); *H01L 29/78606* (2013.01); *H01L 29/78633* (2013.01); *H01L 29/78696* (2013.01)

(58) Field of Classification Search
CPC ....... H01L 2924/13069; H01L 27/1214; H01L 29/41733; H01L 29/42384; H01L 29/66265; H01L 29/66742–29/6675; H01L 29/7317; H01L 29/786
See application file for complete search history.

(56) References Cited

U.S. PATENT DOCUMENTS

| | | | |
|---|---|---|---|
| 2013/0092945 A1* | 4/2013 | Honda | H01L 29/7869 257/57 |
| 2013/0161608 A1 | 6/2013 | Yamazaki | |
| 2014/0014947 A1 | 1/2014 | Yamazaki | |
| 2014/0054717 A1 | 2/2014 | Edge | |
| 2014/0131701 A1 | 5/2014 | Watanabe et al. | |

FOREIGN PATENT DOCUMENTS

| | | |
|---|---|---|
| JP | 2014033194 A | 2/2014 |
| JP | 2014-116591 A | 6/2014 |
| JP | 2014-130337 A | 7/2014 |
| JP | 2014-220492 A | 11/2014 |
| KR | 1020140039840 A | 4/2014 |
| KR | 1020140118691 A | 10/2014 |

* cited by examiner

Unbound oxygen atom

An electron captured in excess oxygen with unpaired electrons

THIN-FILM TRANSISTOR ARRAY SUBSTRATE

This application is a National Stage Entry of International Application No. PCT/KR2015/013802, filed on Dec. 16, 2015, and claims the benefit of Korean Patent Application No. 10-2014-0181296, filed on Dec. 16, 2014 and Korean Patent Application No. 10-2015-0179783, filed on Dec. 16, 2015, all of which are hereby incorporated by reference in their entirety for all purposes as if fully set forth herein.

TECHNICAL FIELD

The present invention relates to a thin-film transistor array substrate.

BACKGROUND ART

With the development of multimedia, flat panel displays (FDPs) are becoming more and more important. Accordingly, a variety of flat panel displays such as liquid crystal display (LCDs), plasma display panels (PDPs), field emission displays (FEDs), organic light emitting displays, and the like are put to practical use. Among them, the organic light emitting displays are drawing attention as next-generation displays because they have a fast response time of 1 ms or less and low power consumption but have no viewing angle issues because they emit light themselves.

Display devices are driven by using either a passive-matrix driving mode or an active-matrix driving mode using thin-film transistors. In the passive-matrix driving mode, is formed an anode and a cathode intersect each other and is driven by selecting a line, whereas, in the active-matrix driving mode, a thin-film transistor is connected to each pixel electrode, and each pixel is driven at a voltage maintained by the capacitance of a capacitor connected to the gate electrode of the thin film transistor.

It is very important for thin-film transistors to have durability and electrical reliability, as well as the basic characteristics such as mobility, leakage current, etc. The active layer in thin film transistors is usually formed of amorphous silicon or polycrystalline silicon. However, amorphous silicon is not electrically reliable despite its benefits like the simple film formation process and the low production cost. Polycrystalline silicon is hard to use over large-areas due to the high processing temperature, and does not provide uniformity for different methods of crystallization.

Because the active layer provides high mobility even if it is formed at low temperatures and the large variations in resistance with oxygen content make it very easy to obtain desired physical properties, an active layer made of oxide semiconductor is currently drawing a great deal of attention in thin-film transistor applications. Examples of oxide semiconductors that can be used as the active layer include zinc oxide (ZnO), indium zinc oxide (InZnO), or indium gallium zinc oxide ($InGaZnO_4$). Thin-film transistors comprising an oxide semiconductor active layer may have various structures. Among them, coplanar and etch stopper structures are commonly used because of device characteristics.

FIG. 1 is a cross-sectional view showing a conventional coplanar thin-film transistor. FIG. 2 is a pattern diagram of atom diffusion. FIG. 3 is an image of a cross-section of a thin-film transistor. Referring to FIG. 1, a light blocking film 20 is positioned on a substrate 15, and a buffer layer 25 is positioned on the light blocking film 20. An active layer 30 of oxide semiconductor is formed on the buffer layer 25. A gate insulating film 35 and a gate electrode 40 are positioned on top of the active layer 30. An interlayer insulating film 45 is positioned on the gate electrode 40, and a source electrode 50a and a drain electrode 50b respectively are connected to the active layer 30, thereby forming a thin-film transistor 10. After the formation of the active layer 30, gate insulating film 35, and gate electrode 40, the thin-film transistor undergoes multiple subsequent thermal treatment processes. As shown in FIG. 2, once the subsequent thermal treatment processes are performed, atomic diffusion occurs in which hydrogen or oxygen atoms in the gate insulating film 35 diffuse into the active layer 30. Referring to FIG. 3, the A area in the active layer has a measured atomic ratio of $In_{1.1}Ga_1Zn_{0.9}O_{23.8}$, and the B area has a measured atomic ratio of $In_{6.4}Ga_1Zn_{1.3}O_{13.6}$, which means a high oxygen content at the interface between the active layer 30 and the gate insulating film 35.

Referring to FIG. 4, if the oxygen content at the interface between the active layer 30 and the gate insulating film 35 increases, this leads to an excess of unbound oxygen atoms. Oxygen is stable with two electrons, but each oxygen atom with an unpaired electron captures an electron moving through the channel in the active layer 30, thus degrading the device's characteristics.

DISCLOSURE

Technical Problem

The present invention is to provide a thin-film transistor array substrate that can prevent device degradation and improve reliability.

Technical Solution

To achieve the object, a thin-film transistor according to an exemplary embodiment of the present invention comprising: an active layer; an intermediate layer; a gate insulating film; a gate electrode; an interlayer insulating film; and source and drain electrodes. The active layer is positioned on a substrate, and the gate insulating film is positioned on the active layer. The gate electrode is positioned on the gate insulating film, and the interlayer insulating film is positioned on the gate electrode. The source and drain electrodes are positioned on the interlayer insulating film and connected to the active layer. The intermediate layer is positioned between the active layer and the gate insulating film, and made of an oxide semiconductor comprising a Group IV element.

Another exemplary embodiment of the present invention provides a thin-film transistor array substrate comprising: a gate electrode; a gate insulating film; an intermediate layer; an active layer; an etch stopper; and source and drain electrodes. The gate electrode is positioned on a substrate, and the gate insulating film is positioned on the gate electrode. The active layer is positioned on the gate insulating film, and the etch stopper is positioned on the active layer. The source and drain electrodes are positioned on the etch stopper and connected to the active layer. The intermediate layer is positioned between active layer and the gate insulating film, and made of an oxide semiconductor comprising a Group IV element.

Yet another exemplary embodiment of the present invention provides a thin-film transistor array substrate comprising: a substrate; an active layer; a gate insulating film; a gate electrode; an interlayer insulating film; and source and drain electrodes. The active layer is positioned on the substrate, and comprises an underlying active layer and an intermediate layer. The gate insulating film is positioned on the gate electrode. The source and drain electrodes are positioned on the interlayer insulating film and connected to the active layer. The intermediate layer is made of an oxide semiconductor comprising a Group IV element.

Advantageous Effects

The present invention offers the advantage of preventing the hydrogen and oxygen elements in the gate insulating film from diffusing into the active layer during thermal treatment by comprising an intermediate layer comprising a Group IV element between the gate insulating film and the active layer, thereby preventing device deterioration.

Moreover, the present invention can prevent positive bias temperature stress caused by excess oxygen by forming an intermediate layer comprising silicon between the active layer and the gate insulating film.

Furthermore, the present invention can prevent excess oxygen from capturing electrons by adding as many hydrogen atoms as excess oxygen remaining in the intermediate layer, thereby preventing positive bias temperature stress.

DESCRIPTION OF DRAWINGS

FIG. 20 is a graph of the drain current vs. gate-source voltage of the thin film transistor according to Embodiment 3;

BEST MODE

Hereinafter, exemplary embodiments of the present invention will be described in detail with reference to the accompanying drawings.

Figure 1:
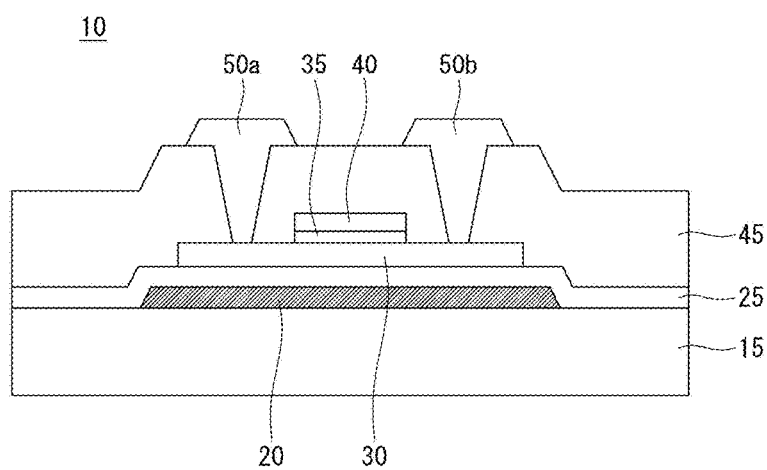
FIG. 1 is a cross-sectional view showing a conventional coplanar thin-film transistor.
Figure 2:
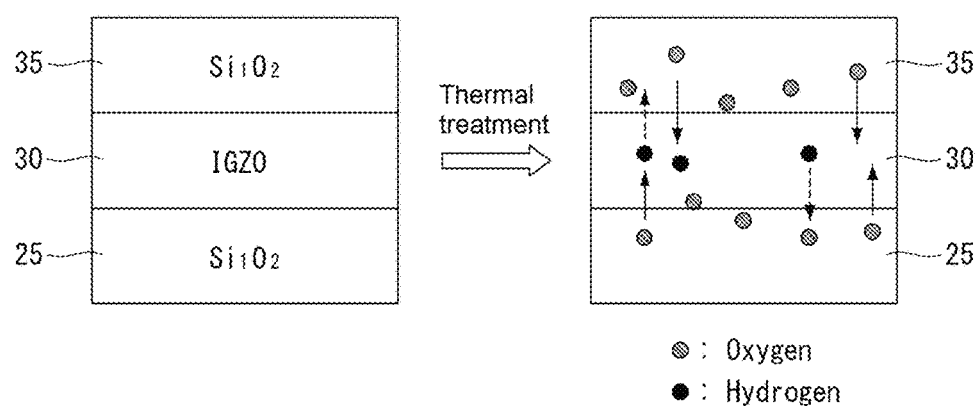
FIG. 2 is a pattern diagram of atom diffusion.
Figure 3:
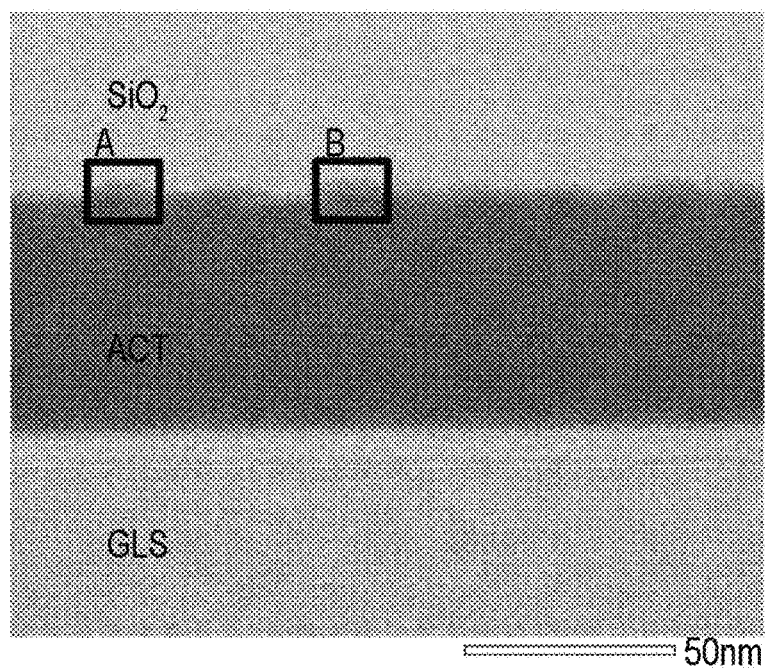
FIG. 3 is an image of a cross-section of a thin-film transistor.
Figure 4:
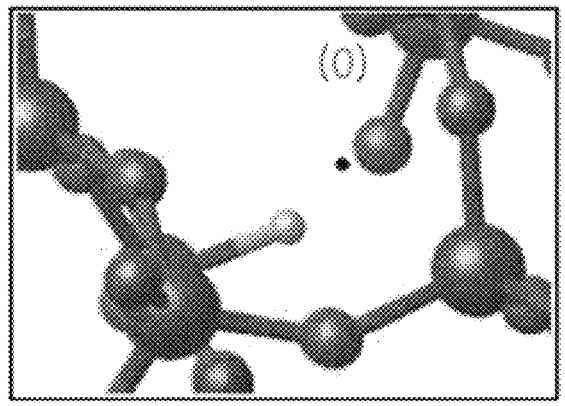
FIG. 4 is a pattern diagram of an unbound oxygen atom.
Figure 4:
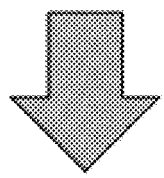
Figure 4:
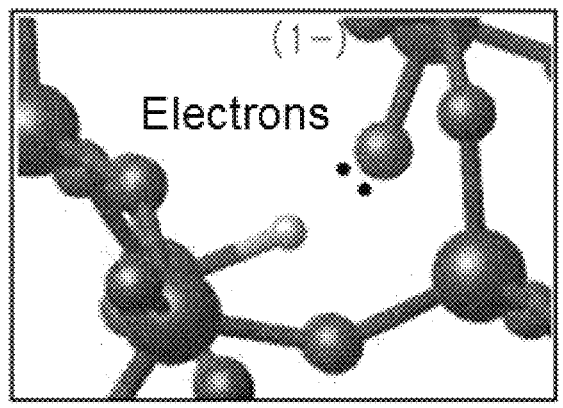
Figure 5:
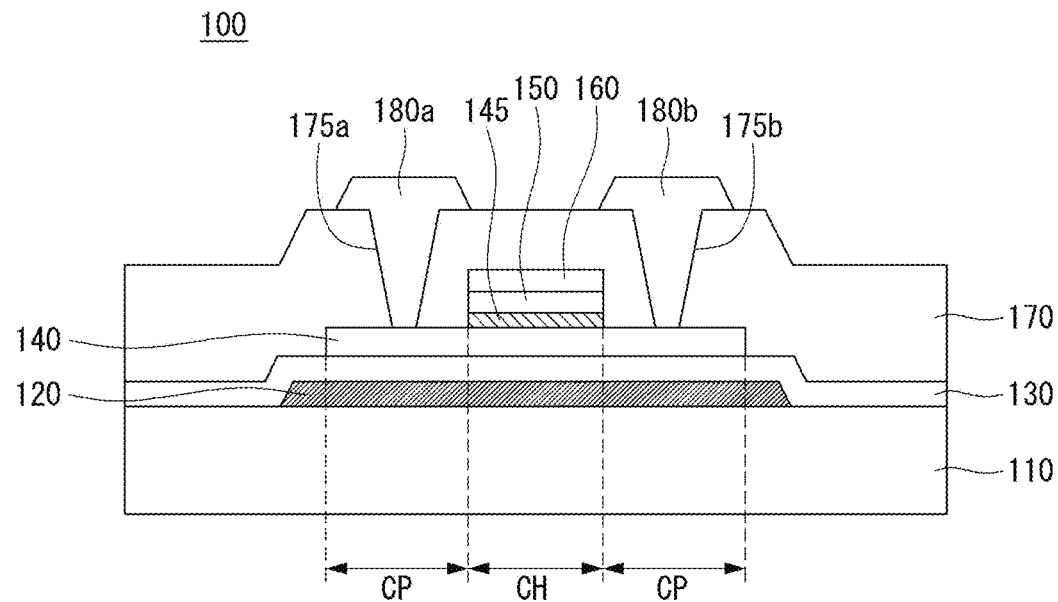
FIG. 5 is a cross-sectional view of a thin-film transistor array substrate according to a first exemplary embodiment of the present invention.

FIG. 5 is a cross-sectional view of a thin-film transistor array substrate according to a first exemplary embodiment of the present invention.

Referring to FIG. 5, a thin-film transistor array substrate 100 according to a first exemplary embodiment of the present invention uses a coplanar thin-film transistor that has a gate electrode positioned on top of an active layer.

More specifically, a light blocking film 120 is positioned on a substrate 110. The substrate 110 is made of transparent or opaque glass, plastic, or metal. The light blocking film 120 is for blocking outside light from entering to inside, and made of a material that can block light. The light blocking film 120 may be made of low-reflectivity materials; for example, resins containing materials such as carbon black that represent black colors or semiconductor materials such as amorphous silicon (a-Si), germanium (Ge), tantalum oxide (TaOx), and copper oxide (CuOx). A buffer layer 130 is positioned over the entire substrate 110 where the light blocking film 120 is positioned. The buffer layer 130 is formed to protect thin-film transistors, which are to be formed in subsequent processes, from impurities such as alkali ions released from the substrate 110 or the underlying layers, and is made of silicon oxide (SiOx), silicon nitride (SiNx), or multiple layers of these elements.

An active layer 140 comprising a channel region CH and a conductive region CP is positioned on the buffer layer 130. The active layer 140 is made of an oxide semiconductor. The oxide semiconductor is an amorphous zinc oxide semiconductor, for example—especially, a-IGZO semiconductor is formed by a sputtering method using a composite target of gallium oxide ($Ga_2O_3$), indium oxide ($In_2O_3$), and zinc oxide (ZnO). Besides, chemical deposition technique such as chemical vapor deposition or atomic layer deposition (ALD) may be used. In this exemplary embodiment of the present invention, a zinc oxide semiconductor may be deposited using oxide targets whose gallium:indium:zinc atomic ratios are 1:1:1, 2:2:1, 3:2:1, and 4:2:1, respectively. However, the active layer 140 of present invention is not limited to zinc oxide semiconductors. Although not shown, the active layer 140 includes a source region and a drain region that is doped with an impurity on both sides.

A gate insulating film 150 is positioned on the active layer 140. The gate insulating film 150 is made of silicon oxide (SiOx), silicon nitride (SiNx), or multiple layers of these elements. The gate insulating film 150 corresponds to a gate electrode 160 positioned on it, and is a similar size to it. Thus the gate insulating film 150 insulates the gate electrode 160 and the active layer 140 from each other. The gate electrode 160 is positioned on the gate insulating film 150. The gate electrode 160 is made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or a single layer or multiple layers of alloys of these elements. The gate electrode 160 is positioned to correspond to the channel region CH of the active layer 140.

An interlayer insulating film 170 is positioned on the substrate 110 where the gate electrode 160 is formed. The interlayer insulating film 170 is made of silicon oxide (SiOx), silicon nitride (SiNx), or multiple layers of these elements. Also, the interlayer insulating film 170 has contact holes 175a and 175b that expose the source and drain regions on both sides of the active layer 140. A source electrode 180a and a drain electrode 180b are positioned on the interlayer insulating film 170. The source electrode 180a and the drain electrode 180b may consist of a single layer or multiple layers. If the source electrode 180a and the drain electrode 180b consist of a single layer, they may be made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements. On the other hand, if the source electrode 180a and the drain electrode 180b consist of multiple layers, they may be made of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium. The source electrode 180a and the drain electrode 180b are connected to the source and drain regions of the active layer 140, respectively, via the contact holes 175a and 175b formed in the interlayer insulating film 170. In this way, the thin-film transistor array substrate 100 according to the first exemplary embodiment of the present invention is made.

In the first exemplary embodiment of the present invention, an intermediate layer 145 is positioned between the active layer 140 and the gate insulating film 150.

The intermediate layer 145 is positioned between the active layer 140 and the gate insulating film 150, and acts as a barrier that prevents hydrogen or oxygen atoms in the gate insulating film 150 from diffusing into the active layer 140 in the subsequent thermal treatment processes. To prevent atomic diffusion, the intermediate layer 145 is made of an oxide semiconductor comprising a Group IV element. For example, the intermediate layer 145 of present invention comprises indium, gallium, and zinc, and may further comprise a Group IV element such as titanium (Ti), zirconium (Zr), silicon (Si), germanium (Ge), tin (Sn), lead (Pb), etc. Preferably, the intermediate layer 145 is made up of indium, gallium, zinc, and silicon oxide. Here, the intermediate layer 145 maintains a pseudo ternary system, with an indium:gallium:zinc atomic ratio of 1.1:1:1.

The atomic ratio of the intermediate layer 145 according to an exemplary embodiment of the present invention is $In_{1.1}Ga_1Zn_1Si_{(0.5\sim2)}O_{(7.3\sim8.15)}$. The atomic percent of indium in the intermediate layer 145 is around 100 to 110% of the atomic percent of indium in the active layer 140 underlying it, and the atomic percent of silicon, a Group IV element, in the intermediate layer 145 is around 50 to 200% of the atomic percent of zinc in the intermediate layer 145. Also, the atomic percent of a Group IV element in the intermediate layer 145 may gradually decrease as this Group IV element goes from the interface adjacent to the gate insulating film 150 down to the interface adjacent to the active layer 140. For example, the atomic percent of silicon may gradually decrease from 200 to 50% of the atomic percent of zinc.

The intermediate layer 145 has a thickness of 40 to 70 Å. Here, if the intermediate layer 145 has a thickness less than 40 Å, it hardly acts as an anti-diffusion film that blocks elements diffusing from the gate insulating film 150. On the other hand, if the intermediate layer 145 has a thickness greater than 70 Å, this affects the channel in the active layer 140, causing a reduction in charge mobility. Accordingly, the intermediate layer 145 of present invention is made with a thickness between 40 and 70 Å.

The intermediate layer 145 of present invention comprises a Group IV element, e.g., silicon, within the layer, whose atoms form strong double bonds, making the intermediate layer 145 thermally stable. Thus, the intermediate layer 145 is provided between the active layer 140 and the gate insulating film 150 to prevent diffusion of light elements only without affecting the electrical properties of the device. This prevents diffusion of the hydrogen and oxygen elements in the gate insulating film 150 during thermal treatment, thereby preventing device deterioration.

Although the intermediate layer 145 has been illustrated and described as being positioned only in the area that makes contact with the channel region CH of the active layer 140 and the gate insulating film 150, the present invention is not limited to this and the intermediate layer 145 may be positioned over the entire active layer 140.

MODE FOR INVENTION

Figure 6:
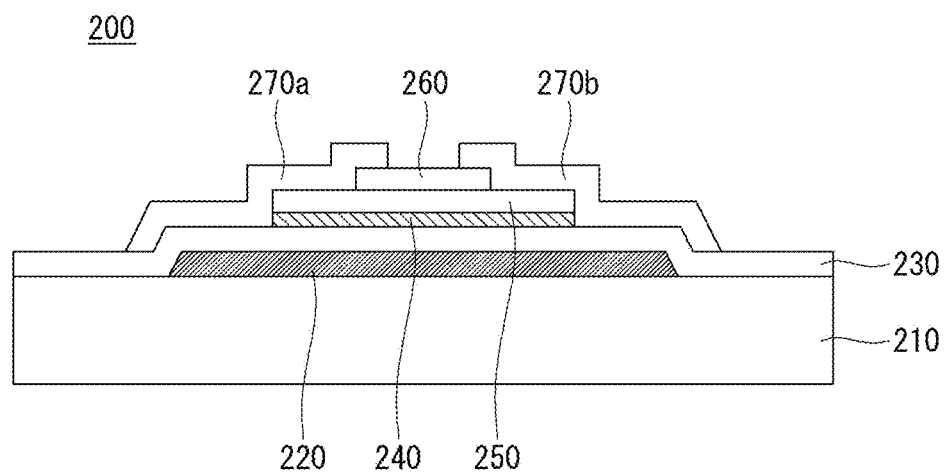
FIG. 6 is a cross-sectional view of a thin-film transistor array substrate according to a second exemplary embodiment of the present invention.

FIG. 6 is a view showing a thin-film transistor array substrate according to a second exemplary embodiment of the present invention.

Referring to FIG. 6, a thin-film transistor array substrate 200 according to the second exemplary embodiment of the present invention uses an etch stopper-type thin-film transistor that has a gate electrode positioned below an active layer and an etch stopper provided on top of the active layer.

More specifically, a gate electrode 220 is positioned on a substrate 210. The substrate 210 is made of transparent or opaque glass, plastic, or metal. The gate electrode 220 is made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or a single layer or multiple layers of alloys of these elements. A gate insulating film 230 is positioned on the gate electrode 220. The gate insulating film 230 is made of silicon oxide (SiOx), silicon nitride (SiNx), or multiple layers of these elements. The gate insulating film 230 insulates the gate electrode 220 positioned under it.

An active layer 250 comprising a channel region CH is positioned on the gate insulating film 230. The active layer 250 is made of an oxide semiconductor. The oxide semiconductor is an amorphous zinc oxide composite semiconductor, for example—especially, a-IGZO semiconductor is formed by a sputtering method using a composite target of gallium oxide ($Ga_2O_3$), indium oxide ($In_2O_3$), and zinc oxide (ZnO). Besides, chemical deposition technique such as chemical vapor deposition or atomic layer deposition (ALD) may be used. In this exemplary embodiment of the present invention, an amorphous zinc oxide composite semiconductor may be deposited using oxide targets whose gallium:indium:zinc atomic ratios are 1:1:1, 2:2:1, 3:2:1, and 4:2:1, respectively. Although not shown, the active layer 250 is doped with an impurity on both sides to form a source region and a drain region.

An etch stopper 260 is positioned on the active layer 250. The etch stopper 260 prevents damage to the active layer 250 in the process of etching source and drain electrodes to be described later. The etch stopper 260 is positioned to correspond to the channel region CH of the active layer 250. The etch stopper 260 is made of silicon oxide (SiOx), silicon nitride (SiNx), or multiple layers of these elements.

A source electrode 270a and a drain electrode 270b are positioned on the etch stopper 260, active layer 250, and gate insulating film 230. The source electrode 270a and the drain electrode 270b may consist of a single layer or multiple layers. If the source electrode 270a and the drain electrode 270b consist of a single layer, they may be made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements. On the other hand, if the source electrode 270a and the drain electrode 270b consist of multiple layers, they may be made of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium. The source electrode 270a and the drain electrode 270b are connected to the source and drain regions of the active layer 250, respectively. In this way, the thin-film transistor array substrate 200 according to the second exemplary embodiment of the present invention is made.

In the second exemplary embodiment of the present invention, an intermediate layer 240 is positioned between the active layer 250 and the gate insulating film 230.

The intermediate layer 240 is positioned between the active layer 250 and the gate insulating film 230, and acts as a barrier that prevents hydrogen or oxygen atoms in the gate insulating film 230 from diffusing into the active layer 250 in the subsequent thermal treatment processes. To prevent atomic diffusion, the intermediate layer 240 is made of an oxide semiconductor comprising a Group IV element. For example, the intermediate layer 240 of present invention comprises indium, gallium, and zinc, and may further comprise a Group IV element such as titanium (Ti), zirconium (Zr), silicon (Si), germanium (Ge), tin (Sn), lead (Pb), etc. Preferably, the intermediate layer 240 is made up of indium, gallium, zinc, and silicon oxide. Here, the intermediate layer 145 maintains a pseudo ternary system, with an indium:gallium:zinc atomic ratio of 0.8:1:1.

The atomic ratio of the intermediate layer 240 according to an exemplary embodiment of the present invention is $In_{0.8}Ga_1Zn_1Si_{0.5}O_{(4.2-4.7)}$. The atomic percent of indium in the intermediate layer 240 is around 80 to 90% of the atomic percent of indium in the active layer 250 underlying it, and the atomic percent of silicon, a Group IV element, in the intermediate layer 240 is 50% of the atomic percent of zinc in the intermediate layer 240. Also, the atomic percent of a Group IV element in the intermediate layer 240 may gradually decrease as this Group IV element goes from the interface adjacent to the gate insulating film 230 up to the interface adjacent to the active layer 250. For example, the atomic percent of silicon may gradually decrease from 200 to 50% of the atomic percent of zinc.

The intermediate layer 240 has a thickness of 50 to 100 Å. Here, if the intermediate layer 240 has a thickness less than 50 Å, it hardly acts as an anti-diffusion film that blocks elements diffusing from the gate insulating film 230. On the other hand, if the intermediate layer 240 has a thickness greater than 100 Å, this affects the channel in the active layer 250, causing a reduction in charge mobility. Accordingly, the intermediate layer 240 of present invention is made with a thickness between 50 and 100 Å.

The intermediate layer 240 of present invention comprises a Group IV element, e.g., silicon, within the layer, whose atoms form strong double bonds, making the intermediate layer 240 thermally stable. Thus, the intermediate layer 240 is provided between the active layer 250 and the gate insulating film 230. This prevents diffusion of the hydrogen and oxygen elements in the gate insulating film 230 during thermal treatment, thereby preventing device deterioration.

Although the intermediate layer 240 has been illustrated and described as being positioned only in the area that makes contact with the entire underside of the active layer 250 and the gate insulating film 230, the present invention is not limited to this and the intermediate layer 240 may be positioned only in the area that makes contact with the channel region CH of the active layer 250 and the gate insulating film 230.

Figure 7:
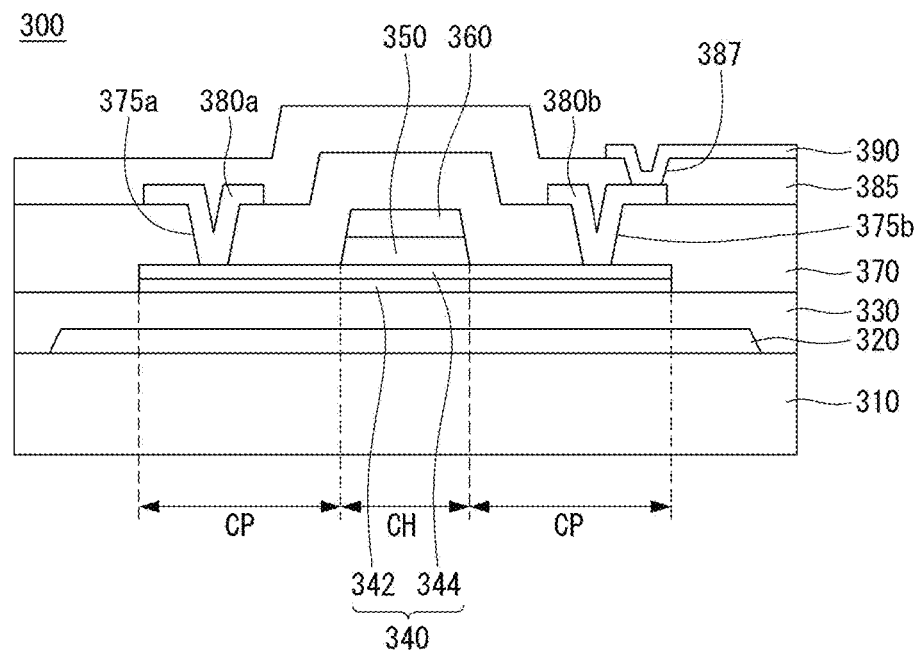
FIG. 7 is a cross-sectional view of a thin-film transistor array substrate according to a third exemplary embodiment of the present invention.

FIG. 7 is a cross-sectional view of a thin-film transistor array substrate according to a third exemplary embodiment of the present invention.

Referring to FIG. 7, a thin-film transistor array substrate 300 according to a fourth exemplary embodiment of the present invention uses a coplanar thin-film transistor that has a gate electrode positioned on top of an active layer.

More specifically, a light blocking film 320 is positioned on a substrate 310. The substrate 310 is made of transparent or opaque glass, plastic, or metal. The light blocking film 320 is for blocking outside light from entering to inside, and made of a material that can block light. The light blocking film 320 may be made of low-reflectivity materials; for example, resins containing materials carbon black that represent black colors or semiconductor materials such as amorphous silicon (a-Si), germanium (Ge), tantalum oxide (TaOx), and copper oxide (CuOx). A buffer layer 330 is positioned over the entire substrate 310 where the light blocking film 320 is positioned. The buffer layer 330 is formed to protect thin-film transistors, which are to be formed in subsequent processes, from impurities such as alkali ions released from the substrate 310 or the underlying layers, and is made of silicon oxide (SiOx), silicon nitride (SiNx), or multiple layers of these elements.

An active layer 340 comprising a channel region CH and a conductive region CP is positioned on the buffer layer 330. In the third exemplary embodiment of the present invention, the active layer 340 comprises a underlying active layer 342 and an intermediate layer 344. The underlying active layer 342 forms the lower part of the active layer 340 and is positioned to make contact with the buffer layer 330, and the intermediate layer 344 forms the upper part of the active layer 344 and is positioned between the underlying active layer 342 and the gate insulating film 350.

The underlying active layer 342 is made of an oxide semiconductor. The oxide semiconductor is an amorphous zinc oxide semiconductor, for example—especially, a-IGZO semiconductor is formed by a sputtering method using a composite target of gallium oxide ($Ga_2O_3$), indium oxide ($In_2O_3$), and zinc oxide (ZnO). Besides, chemical deposition technique such as chemical vapor deposition or atomic layer deposition (ALD) may be used. In this exemplary embodiment of the present invention, a zinc oxide semiconductor may be deposited using oxide targets whose gallium:indium:zinc atomic ratios are 1:1:1, 2:2:1, 3:2:1, and 4:2:1, respectively. However, the active layer 340 of present invention is not limited to zinc oxide semiconductors. Although not shown, the active layer 340 includes a source region and a drain region that is doped with an impurity on both sides.

The intermediate layer 344 is positioned between the underlying active layer 342 and the gate insulating film 350, and acts as a barrier that prevents hydrogen or oxygen atoms in the gate insulating film 350 from diffusing into the active layer 340 in the subsequent heat treatment processes. To prevent atomic diffusion, the intermediate layer 344 is made of an oxide semiconductor comprising a Group IV element. For example, the intermediate layer 344 of present invention comprises indium, gallium, and zinc, and may further comprise a Group IV element such as titanium (Ti), zirconium (Zr), silicon (Si), germanium (Ge), tin (Sn), lead (Pb), etc. Preferably, the intermediate layer 344 is made up of indium, gallium, zinc, and silicon oxide. Here, the intermediate layer 344 maintains a pseudo ternary system, with an indium:gallium:zinc atomic ratio of 1.1:1:1.

The atomic ratio of the intermediate layer 344 according to an exemplary embodiment of the present invention is $In_5Ga_1Zn_1Si_{(12\sim13)}O_{35}$. The atomic percent of indium in the intermediate layer 344 is 4 to 6 times greater than the atomic percent of gallium in the underlying active layer 342, and the atomic percent of silicon, a Group IV element, in the intermediate layer 344 is 12 or 13 times greater than the atomic percent of gallium in the intermediate layer 344. Also, the amount of oxygen in the intermediate layer 344 makes up 0 to 9% of the composition of a pseudo ternary system and a Group IV element in an oxide. Also, the atomic percent of a Group IV element, e.g., silicon (Si), in the intermediate layer 344 may gradually decrease as the silicon (Si) goes from the interface adjacent to the underlying active layer 342 down to the interface adjacent to the underlying active layer 342. For example, the atomic percent of silicon may gradually decrease from 6 to 4 times the atomic percent of gallium.

The intermediate layer 344 has a thickness of 50 to 100 Å. Here, if the intermediate layer 344 has a thickness less than 50 Å, it hardly acts as an anti-diffusion film that blocks elements diffusing from the gate insulating film 350. On the other hand, if the intermediate layer 344 has a thickness greater than 100 Å, this affects the channel in the active layer 250, causing a reduction in charge mobility. Accordingly, the intermediate layer 344 of present invention is made with a thickness between 50 and 100 Å.

The intermediate layer 344 of present invention comprises a Group IV element, e.g., silicon, within the layer, whose atoms form strong double bond, making the intermediate layer 344 thermally stable. Thus, the intermediate layer 344 is provided between the active layer 340 and the gate insulating film 350 to prevent diffusion of light elements only without affecting the electrical properties of the device. This prevents diffusion of the hydrogen and oxygen elements in the gate insulating film 350 during thermal treatment, thereby preventing device deterioration.

Although the intermediate layer 344 has been illustrated and described as being positioned over the entire area of the underlying active layer 342, the present invention is not limited to this and the intermediate layer 344 may be positioned only in the channel region CH of the active layer 340.

A gate insulating film 350 is positioned on the active layer 340. The gate insulating film 350 is made of silicon oxide (SiOx), silicon nitride (SiNx), or multiple layers of these elements. The gate insulating film 350 corresponds to a gate electrode 360 positioned on it, and is a similar size to it. The gate insulating film 350 insulates the gate electrode 360 and the active layer 340 from each other. The gate electrode 360 is positioned on the gate insulating film 350. The gate electrode 360 is made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or a single layer or multiple layers of alloys of these elements. The gate electrode 360 is positioned to correspond to the channel region CH of the active layer 340.

An interlayer insulating film 370 is positioned on the substrate 310 where the gate electrode 360 is formed. The interlayer insulating film 370 is made of silicon oxide (SiOx), silicon nitride (SiNx), or multiple layers of these elements. Also, the interlayer insulating film 370 has contact holes 375a and 375b that expose the source and drain regions on both sides of the active layer 340. A source electrode 380a and a drain electrode 380b are positioned on the interlayer insulating film 370. The source electrode 380a and the drain electrode 380b may consist of a single layer or multiple layers. If the source electrode 380a and the drain electrode 380b consist of a single layer, they may be made of any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements. On the other hand, if the source electrode 380a and the drain electrode 380b consist of multiple layers, they may be made of two layers of molybdenum/aluminum-neodymium, molybdenum/aluminum, or titanium/aluminum, or three layers of molybdenum/aluminum-neodymium/molybdenum, molybdenum/aluminum/molybdenum, or titanium/aluminum/titanium. The source electrode 380a and the drain electrode 380b are connected to the source and drain regions of the active layer 340, respectively, via the contact holes 375a and 375b formed in the interlayer insulating film 370.

A passivation film 385 is positioned on the substrate 310 where the source electrode 380 and the drain electrode 380b are positioned. The passivation film 385 serves to protect the underlying thin-film transistors and insulate them from one another. The passivation film 385 is made of silicon oxide (SiOx), silicon nitride (SiNx), or multiple layers of these elements, and has a via hole 387 that exposes the drain electrode 380b. A pixel electrode 390 is connected to the drain electrode 380b by the via hole 387 and supplied with a data voltage. The pixel electrode 390 is made of ITO (indium tin oxide), IZO (indium zinc oxide), ITZO (indium tin zinc oxide), etc. which are transparent and highly conductive. In this way, the thin-film transistor array substrate 300 according to the third exemplary embodiment is made.

Figure 8:
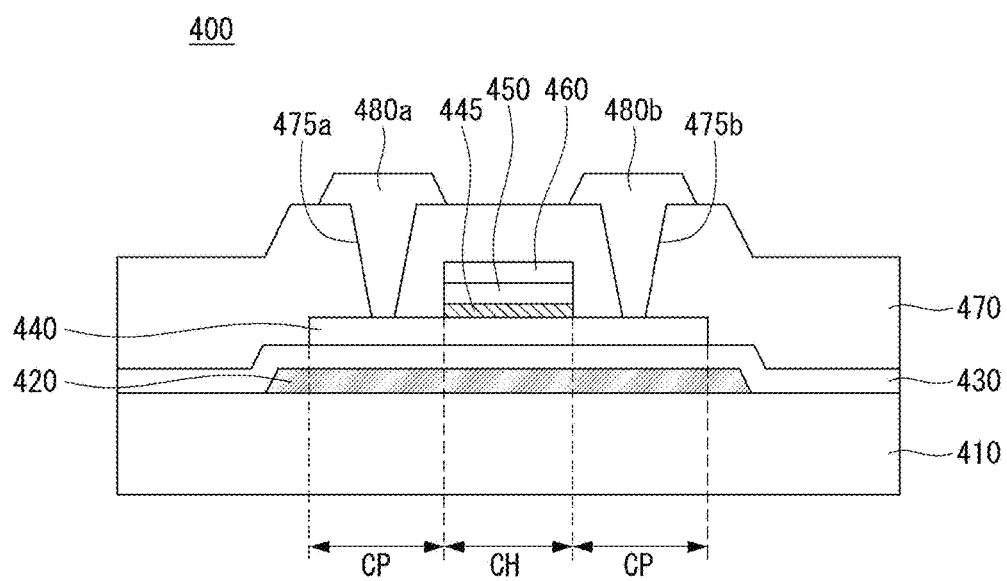
FIG. 8 is a cross-sectional view of a thin-film transistor array substrate according to a fourth exemplary embodiment of the present invention.

FIG. 8 is a cross-sectional view of a thin-film transistor array substrate according to a fourth exemplary embodiment of the present invention.

Referring to FIG. 8, a thin-film transistor array substrate 400 according to the fourth exemplary embodiment of the present invention uses a coplanar thin-film transistor that has a gate electrode positioned on top of an active layer. The same components as the thin-film transistor array substrate 100 according to the firth exemplary embodiment of the present invention will be omitted.

More specifically, a light blocking film 420 is positioned on a substrate 410, and a buffer layer 430 is positioned on the entire substrate 410 where the light blocking film 420 is positioned. An active layer 440 comprising a channel region CH and a conductive region CP is positioned on the buffer layer 430. The active layer 440 is made of an oxide semiconductor. The oxide semiconductor is an amorphous zinc oxide semiconductor, for example—especially, a-IGZO semiconductor is formed by a sputtering method using a composite target of gallium oxide ($Ga_2O_3$), indium oxide ($In_2O_3$), and zinc oxide (ZnO). Besides, chemical deposition technique such as chemical vapor deposition or atomic layer deposition (ALD) may be used. In this exemplary embodiment of the present invention, a zinc oxide semiconductor may be deposited using oxide targets whose gallium:indium:zinc atomic ratios are 1:1:1, 2:2:1, 3:2:1, and 4:2:1, respectively. However, the active layer 440 of present invention is not limited to zinc oxide semiconductors. Although not shown, the active layer 440 includes a source region and a drain region that is doped with an impurity on both sides.

A gate insulating film 450 is positioned on the active layer 440, and a gate electrode 460 is positioned on the gate insulating film 450. The gate electrode 460 is positioned to correspond to the channel region CH of the active layer 440. An interlayer insulating film 470 is positioned on the substrate 410 where the gate electrode 460 is formed. The interlayer insulating film 470 has contact holes 475a and 475b that expose the source and drain regions on both sides of the active layer 440. A source electrode 480a and a drain electrode 480b are positioned on the interlayer insulating film 470. The source electrode 480a and the drain electrode 480b are connected to the source and drain regions of the active layer 440, respectively, via the contact holes 475a and 475b formed in the interlayer insulating film 470. In this way, the thin-film transistor array substrate 400 according to the fourth exemplary embodiment of the present invention is made.

In the meantime, an excess of oxygen diffusing from the gate insulating film 450 due to the subsequent heat treatment processes may exist at the interface between the active layer 440 and the gate insulating film 450. High oxygen content in the interface between the active layer 440 and the gate insulating film 450 may lead to positive bias temperature stress, whereas low oxygen content makes the semiconductor device conductive, thereby deteriorating the device characteristics.

In the present invention, an intermediate layer 445 is formed between the active layer 440 and the gate insulating film 450. The intermediate layer 445 serves to avoid positive bias temperature stress and prevent the device from becoming conductive. The intermediate layer 445 is made of an oxide semiconductor comprising a Group IV element in order to remove an excess of oxygen in the interface, i.e., intermediate layer 450, between the active layer 440 and the gate insulating film 450. For example, the intermediate layer 445 of present invention comprises indium, gallium, and zinc, and may further comprise a Group IV element such as titanium (Ti), zirconium (Zr), silicon (Si), germanium (Ge), tin (Sn), lead (Pb), etc. Preferably, the intermediate layer 145 is made up of indium, gallium, zinc, and silicon oxide. If the intermediate layer 445 comprises a Group IV element, preferably, silicon (Si), silicon is bound to unbound oxygen atoms, thereby reducing the amount of unbound oxygen atoms. That is, by comprising a Group IV element, the intermediate layer 445 may remove an excess of oxygen and prevent positive bias temperature stress.

The silicon content in the intermediate layer 445 of present invention may range between $2.9 \times 10^{22}$ $cm^{-3}$ and $3.2 \times 10^{22}$ $cm^{-3}$. If the silicon content in the intermediate layer 445 is equal to or greater than $2.9 \times 10^{22}$ $cm^{-3}$, an excess of oxygen atoms in the intermediate layer 445 and silicon may combine to reduce the amount of oxygen and prevent positive bias temperature stress. On the other hand, if the silicon content in the intermediate layer 445 is equal to or less than $3.2 \times 10^{22}$ $cm^{-3}$, the amount of excess oxygen atoms in the intermediate layer 445 decreases too much and this makes the device conductive, thereby preventing deterioration of the thin-film transistor characteristics.

Also, even if the amount of unbound oxygen atoms is reduced by the intermediate layer 445 comprising a Group IV element, there may remain some unbound oxygen atoms. The remaining unbound oxygen atoms have an effect on positive bias temperature stress. Accordingly, the intermediate layer 445 of present invention comprises some amount of hydrogen so that hydrogen atoms are bound to unbound oxygen atoms to keep electrons from combining with the unbound oxygen atoms. In other words, hydrogen atoms are bound to an excess of oxygen atoms in the intermediate layer 445 to keep electrons in the active layer from combining with the excess of oxygen atoms, thereby preventing positive bias temperature stress.

The amount of excess oxygen in the intermediate layer 445 is defined by the amount of oxygen relative to metal. The intermediate layer 445 is made up of indium, gallium, zinc, and oxygen, with silicon added to it, which means that the intermediate layer 445 comprises indium, gallium, zinc, silicon, and oxygen. The intermediate layer 445 may be represented by $In_aGa_bZn_cSi_dO_y$, and the atomic ratio of indium/zinc/gallium/silicon is 1.5:1:1.5:2, so Y=1.5a+1.5b+1c+2d. Suppose that the actual amount of oxygen measured in the intermediate layer 445 is x, if x is greater than y, this means that there is an excess of oxygen, or if y is greater than x, this means that there is a lack of oxygen. Accordingly, the intermediate layer 445 may contain as many hydrogen atoms as excess oxygen atoms remaining in the intermediate layer 445, and the hydrogen content may range between $1.2 \times 10^{21}$ $cm^{-3}$ and $1.6 \times 10^{21}$ $cm^{-3}$. The hydrogen content varies with the aforementioned silicon content. For example, if the silicon content is $2.9 \times 10^{22}$ $cm^{-3}$, then the hydrogen content may be $1.6 \times 10^{21}$ $cm^{-3}$, and if the silicon content is $3.2 \times 10^{22}$ cm$^{-3}$, then the hydrogen content may be 1.2×10$^{21}$ cm$^{-3}$. That is, when there is a certain content of silicon added to the intermediate layer 445, as many hydrogen atoms as excess oxygen atoms remaining in the intermediate layer 445 may be added.

Therefore, the intermediate layer 445 may comprise as many hydrogen atoms as excess oxygen atoms remaining in the intermediate layer 445, and the hydrogen content may range between 1.2×10$^{21}$ cm$^{-3}$ and 1.6×10$^{21}$ cm$^{-3}$. The hydrogen content varies with the aforementioned silicon content. For example, if the silicon content is 2.9×10$^{22}$ cm$^{-3}$, then the hydrogen content may be 1.6×10$^{21}$ cm$^{-3}$, and if the silicon content is 3.2×10$^{22}$ cm$^{-3}$, then the hydrogen content may be 1.2×10$^{21}$ cm$^{-3}$. That is, when there is a certain content of silicon added to the intermediate layer 445, as many hydrogen atoms as excess oxygen atoms remaining in the intermediate layer 445 may be added.

The following Table 1 shows variation of the thin-film transistors' threshold voltage and positive bias temperature stress with the amount of oxygen relative to metal in the intermediate layer.

TABLE 1

| Amount of oxygen relative to metal (%) | Threshold voltage (Vth(V)) | Positive bias temperature stress (PBTS, ΔVth(V)) |
| --- | --- | --- |
| 89 | Device became conductive | — |
| 90 | Device became conductive | — |
| 94 | Device became conductive | — |
| 101.2 | 0.69 | 0.21 |
| 101.3 | 0.72 | 0.35 |
| 112 | 0.88 | 2.61 |

Referring to Table 1, if the amount of oxygen relative to metal in the intermediate layer was reduced to equal to or less than 100%, the device became conductive and no threshold voltage was observed, and also no positive bias temperature stress was observed. In contrast, if the amount of oxygen relative to metal in the intermediate layer was increased to equal to or greater than 100%, there was an increase in threshold voltage increases and also in positive temperature stress.

From these results, it can be seen that the less the amount of oxygen, i.e., excess oxygen, relative to metal in the intermediate layer, the less deterioration is caused by positive bias temperature stress, which may result in an improvement in device reliability.

In the meantime, the intermediate layer 445 has a thickness of 50 to 100 Å. Here, if the intermediate layer 445 has a thickness equal to or greater than 50 Å, it may act as an anti-diffusion film that blocks elements diffusing from the gate insulating film 450. On the other hand, if the intermediate layer 445 has a thickness equal to or less than 100 Å, the intermediate layer 445 acts as a channel for the active layer 445, thereby preventing device deterioration. Accordingly, the intermediate layer 445 of present invention is made with a thickness between 50 and 100 Å.

As discussed above, the thin-film transistor array substrate according to the fourth exemplary embodiment of the present invention may comprise an intermediate layer comprising silicon between the active layer and the gate insulating film so as to prevent positive bias temperature stress.

Although the intermediate layer 445 has been illustrated and described as being positioned only in the area that makes contact with the channel region CH in the active layer 440 and the gate insulating film 450, the present invention is not limited to this and the intermediate layer 445 may be positioned over the entire active layer 440.

Figure 9:
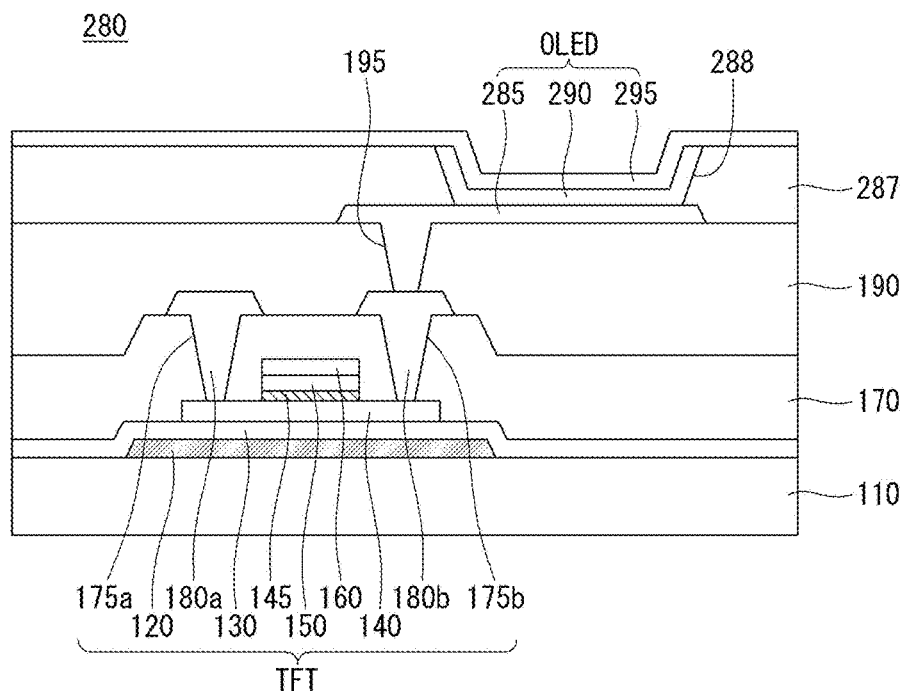
FIG. 9 is a view showing a display device comprising a thin-film transistor array substrate according to the first exemplary embodiment of the present invention.

FIG. 9 is a view showing a display device comprising a thin-film transistor array substrate according to the first exemplary embodiment of the present invention. A description of the above-described thin-film transistor array substrate will be omitted below, and a description will be given of an organic light emitting display as an example of a display device. However, the present invention is not limited to organic light emitting displays, but is also applicable to flat panel displays such as liquid crystal displays.

Referring to FIG. 9, a thin film transistor TFT comprising an active layer 140, a gate electrode 160, a source electrode 180*a*, and a drain electrode 180*b* is positioned on a substrate 110. An organic insulating film is positioned over these components. The organic insulating film 190 may be made of an organic material such as photoacryl, polyimide, benzocyclobutene resin, acrylate resin, etc. The organic insulating film 190 has a via hole 195 that exposes the drain electrode 180*b* of the thin-film transistor TFT.

A pixel electrode 285 may be positioned on the organic insulating film 190. The pixel electrode 285 may consist of a transparent conductive film. The transparent conductive film may be a transparent and conductive material such as ITO (indium tin oxide) or IZO (indium zinc oxide). Here, in the case of a top-emitting organic light emitting display, a reflective metal film with high reflectivity, such as aluminum (Al), aluminum-neodymium (Al—Nd), silver (Ag), an silver alloy (Ag alloy), etc. may be further provided under the transparent conductive film, and the pixel electrode 285 may have a structure of transparent conductive film/reflective metal film/transparent conductive film. Preferably, the pixel electrode 285 may have a structure of ITO/Ag/ITO, for example. The pixel electrode 285 is connected to the drain electrode 180*b* via the contact hole 195 in the organic insulating film 190.

A bank layer 287 exposing the pixel electrode 285 is positioned on the pixel electrode 285. The bank layer 287 defines a pixel and insulates the pixel electrode 285, and is made of an organic material such as photoacryl, polyimide, benzocyclobutene resin, acrylate resin, etc. The bank layer 287 comprises an opening 288 exposing the pixel electrode 285. An organic film layer 290 is positioned on the pixel electrode 285 and the bank layer 287. The organic film layer 290 at least comprises a light emitting layer, and may further comprise a hole injection layer, a hole transport layer, an electron transport layer, or an electron injection layer. An opposing electrode 295 is positioned on the organic film layer 290. The opposing electrode 295 may be made of metals with a low work function, such as silver (Ag), magnesium (Mg), or calcium (Ca). As such, an organic light emitting diode OLED consisting of the pixel electrode 285, organic film layer 290, and opposing electrode 295 is formed. In this way, an organic light emitting display 280 with thin-film transistors TFT and organic light emitting diodes OLED on a substrate 110 is made.

Now, a method of manufacturing a thin-film transistor array substrate according to the above exemplary embodiments of the present invention will be described. While the following description will be given of the above-described coplanar-type thin-film transistor according to the first exemplary embodiment, the present invention is also applicable to the etch stopper-type thin film transistor according to the second exemplary embodiment.

FIGS. 10A through 10E are views showing each process of the method of manufacturing a thin-film transistor array substrate according to the first exemplary embodiment of the present invention.

Figure 10A:
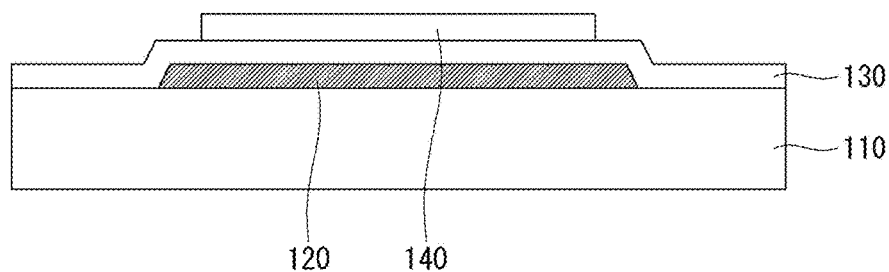
FIGS. 10A through 10E are views showing each process of the method of manufacturing a thin-film transistor array substrate according to the first exemplary embodiment of the present invention.

Referring to FIG. 10A, a light blocking film 120 is formed by forming a resin containing a material, such as carbon black, that represent a black color or a semiconductor material, such as amorphous silicon (a-Si), germanium (Ge), tantalum oxide (TaOx), and copper oxide (CuOx), on a substrate 100 made of transparent or opaque glass, plastic, or metal and maintaining its flatness, and then patterning it using a mask. The light blocking film 120 is formed for each area where an active layer is to be formed later. However, the present invention is not limited to this, and the light blocking film 120 may be formed on the entire surface of the substrate 110.

Subsequently, a buffer layer 130 is formed by depositing silicon oxide (SiOx) or silicon nitride (SiNx) on the substrate 110 with the light blocking film 120 formed on it by a deposition method such as CVD (chemical vapor deposition), PECVD (plasma enhanced chemical vapor deposition), or sputtering deposition. Then, an oxide semiconductor layer is laminated on the substrate 110 with the buffer layer 130 formed on it by a sputtering method using a composite target of indium oxide ($In_2O_3$), tin oxide (SnO), and zinc oxide (ZnO). Next, an active layer 140 is formed by patterning the oxide semiconductor layer using a mask. Besides, the active layer 140 may be formed by a chemical vapor deposition method such as chemical vapor deposition or atomic layer deposition (ALD). The active layer 140 is formed to correspond to the light blocking film 120 formed on the substrate 110, so that the light coming from below from is kept from reaching the active layer 140, thereby preventing leakage current due to the light.

Figure 10B:
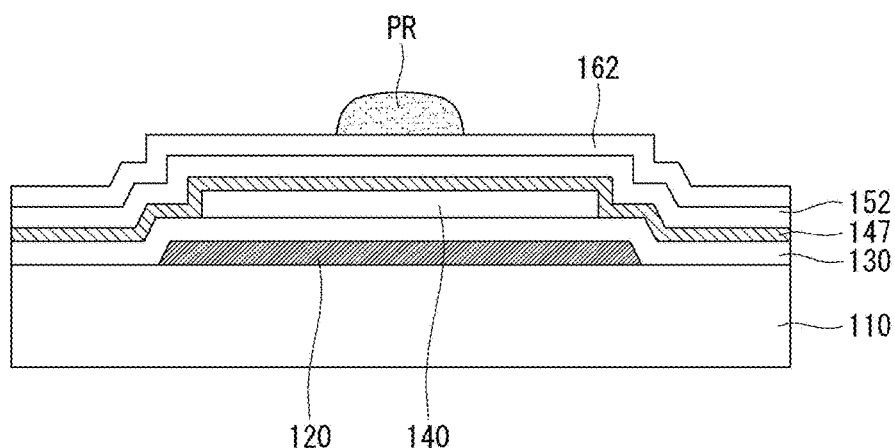

Next, referring to FIG. 10B, an oxide semiconductor layer 147 is laminated on the substrate 110 with the active layer 140 formed on it by a sputtering method using a composite target of indium oxide ($In_2O_3$), tin oxide (SnO), or zinc oxide (ZnO). Subsequently, an insulating layer 152 is formed by depositing silicon oxide SiOx or silicon nitride SiNx by CVD, PECVD, or sputtering deposition. Then, a metal layer 162 is formed on the insulating layer 152 by depositing any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements by sputtering deposition. Then, a photoresist pattern PR is formed by applying a photoresist onto the metal layer 162 and exposing it to light and developing it. The photoresist pattern PR corresponds to where a channel region of the active layer 140 is to be formed.

Figure 10C:
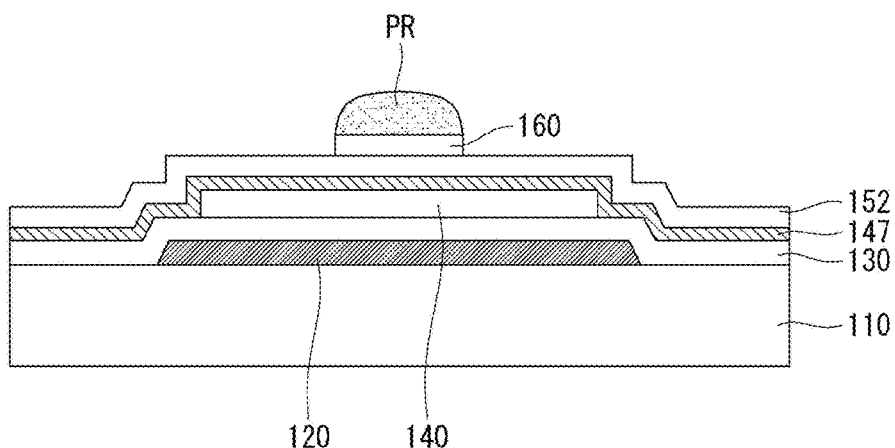

Next, referring to FIG. 10C, a gate electrode 160 is formed by etching the metal layer 162 using the photoresist pattern PR as a mask. The metal layer 162 is etched by wet etching using an etching solution for etching the target material.

Figure 10D:
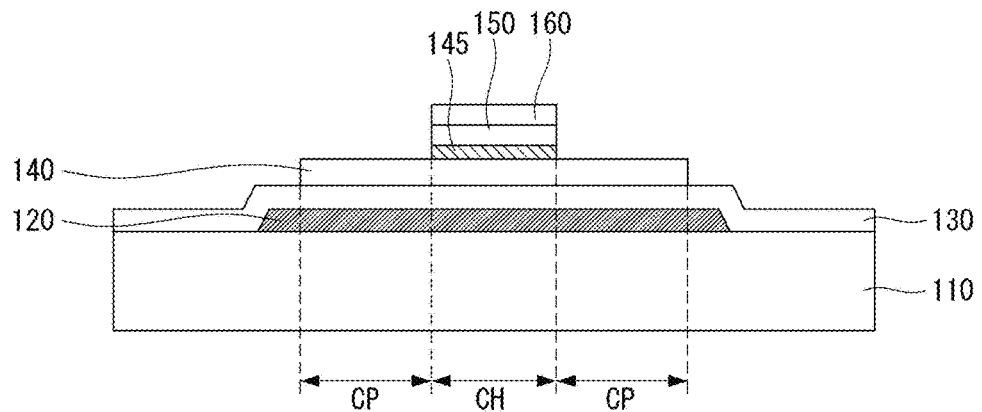

Next, referring to FIG. 10D, a gate insulating film 150 is formed by etching the insulating layer 152 using the photoresist pattern PR. The insulating layer 152 is etched by a plasma etching process using a gas such as argon (Ar), and has a similar size to the gate electrode 160 positioned on top of the insulating layer 152. When the insulating layer 152 is fully etched in the plasma etching process and hence the oxide semiconductor layer 147 and the active layer 140 are exposed, an etching process is performed on the oxide semiconductor layer 147 and the active layer 140 for a certain amount of time to make the active layer 140 conductive. That is, once plasma etching is performed on the active layer 140, oxygen atoms are released out of the active layer 140 and instead an impurity is injected into the active layer 140, thereby improving the conduction characteristics. Accordingly, a channel region CH in the active layer 140 is formed to correspond to where the gate electrode 160 and the gate insulating film 150 are positioned, and a conductive region CP is formed to correspond to the remaining part of the active layer 140 except the channel region CH. Then, an intermediate layer 145 is formed by etching the oxide semiconductor layer 147 exposed by the gate insulating film 150. Accordingly, the gate electrode 160, gate insulating film 150, and intermediate layer 145 are formed in the channel region CH of the active layer 140 and have a similar size. Afterwards, the photoresist pattern PR is removed by stripping.

Figure 10E:
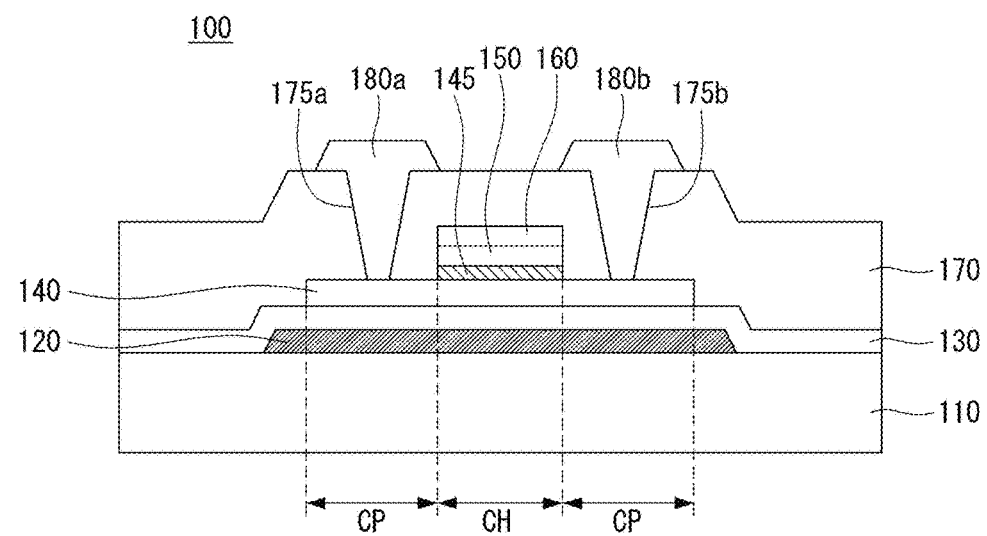

Next, referring to FIG. 10E, an interlayer insulating film 170 is formed by depositing silicon oxide (SiOx) or silicon nitride (SiNx) on the substrate 110 with the gate electrode 160 formed on it by a deposition method such as CVD (chemical vapor deposition), PECVD (plasma enhanced chemical vapor deposition), or sputtering deposition. Then, contact holes 175a and 175b exposing the conductive region CP on both sides of the active layer 140 are formed by etching the interlayer insulating film 170. Then, a source electrode 180a and a drain electrode 180b are formed by laminating any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements on the substrate 110 and patterning it. The source electrode 180a and the drain electrode 180b are connected to the active layer 140 via the contact holes 175a and 175b formed in the interlayer insulating film 170. As such, a thin-film transistor TFT is formed, which comprises the active layer 140, the intermediate layer 145, the gate electrode 160, the source electrode 180a, and the drain electrode 180b.

FIGS. 11A through 11H are views showing each process of the method of manufacturing a thin-film transistor array substrate according to the third exemplary embodiment of the present invention.

Figure 11A:
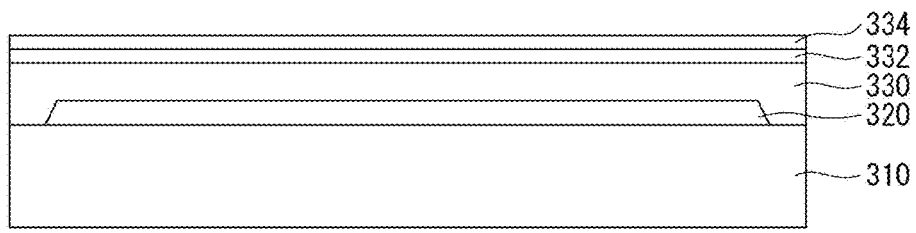
FIGS. 11A through 11H are views showing each process of the method of manufacturing a thin-film transistor array substrate according to the third exemplary embodiment of the present invention.

Referring to FIG. 11A, a light blocking film 320 is formed by forming a resin containing a material, such as carbon black, that represents a black color or a semiconductor material, such as amorphous silicon (a-Si), germanium (Ge), tantalum oxide (TaOx), and copper oxide (CuOx), on a substrate 310 made of transparent or opaque glass, plastic, or metal and maintaining its flatness, and then patterning it using a mask. The light blocking film 320 is formed for each area where an active layer is to be formed later. However, the present invention is not limited to this, and the light blocking film 320 may be formed on the entire surface of the substrate 310.

Subsequently, a buffer layer 330 is formed by depositing silicon oxide (SiOx) or silicon nitride (SiNx) on the substrate 310 with the light blocking film 320 formed on it by a deposition method such as CVD (chemical vapor deposition), PECVD (plasma enhanced chemical vapor deposition), or sputtering deposition. Then, a first oxide semiconductor layer 332 is laminated on the substrate 310 with the buffer layer 330 formed on it by a sputtering method using a composite target of indium oxide ($In_2O_3$), tin oxide (SnO), and zinc oxide (ZnO). Then, a second oxide semiconductor layer 334 is laminated by a sputtering method using a composite target of indium oxide ($In_2O_3$), tin oxide (SnO), silicon oxide (SiOx), and zinc oxide (ZnO).

Figure 11B:
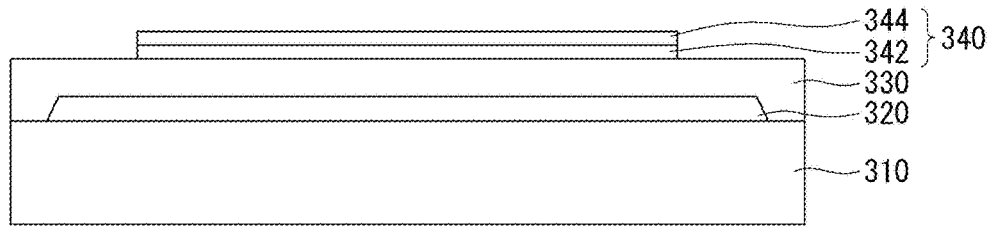

Referring to FIG. 11B, an active layer 340 comprising a underlying active layer 342 and an intermediate layer 344 is formed by patterning the first oxide semiconductor layer 332 and the second oxide semiconductor layer 334 using a mask. Besides, the active layer 340 may be formed by a chemical vapor deposition method such as chemical vapor deposition or atomic layer deposition (ALD). The active layer 340 is formed to correspond to the light blocking film 120 formed on the substrate 310, so that the light coming from below from is kept from reaching the active layer 340, thereby preventing leakage current due to the light.

Figure 11C:
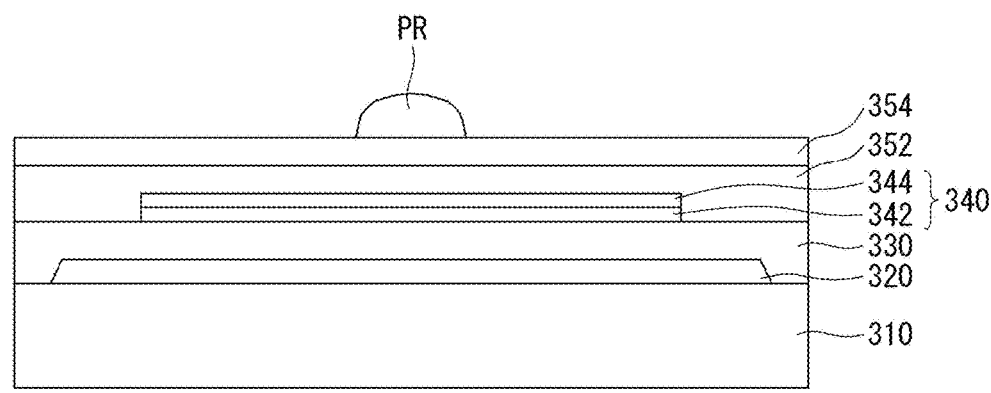

Next, referring to FIG. 11C, an insulating layer 352 is formed on the substrate 310 with the active layer 340 formed on it by depositing silicon oxide SiOx or silicon nitride SiNx by CVD, PECVD, or sputtering deposition. Then, a metal layer 354 is formed on the insulating layer 352 by depositing any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements by sputtering deposition. Then, a photoresist pattern PR is formed by applying a photoresist onto the metal layer 354 and exposing it to light and developing it. The photoresist pattern PR corresponds to where a channel region of the active layer 340 is to be formed.

Figure 11D:
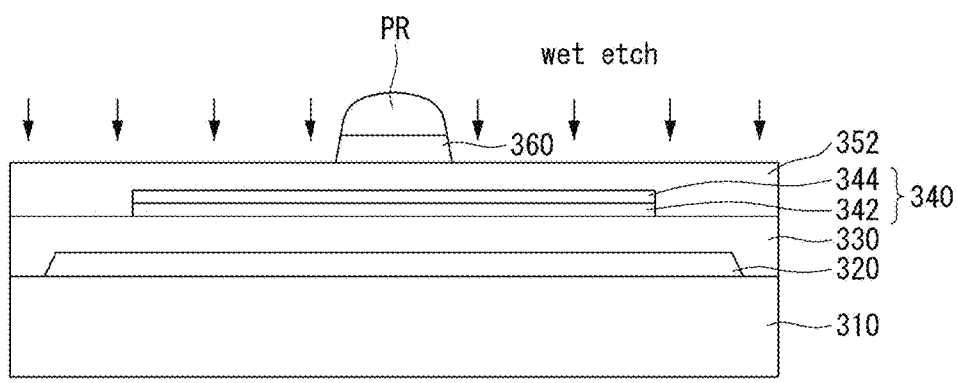

Next, referring to FIG. 11D, a gate electrode 360 is formed by etching the metal layer 354 using the photoresist pattern PR as a mask. The metal layer 354 is etched by wet etching using an etching solution for etching the target material.

Figure 11E:
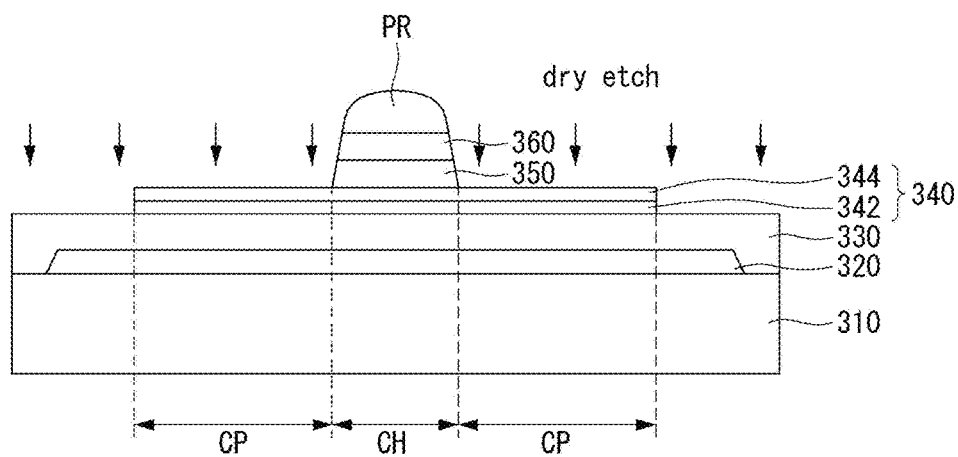

Next, referring to FIG. 11E, a gate insulating film 350 is formed by etching the insulating layer 352 using the photoresist pattern PR. The insulating layer 352 is etched by a plasma etching process using a gas such as argon (Ar), and has a similar size to the gate electrode 360 positioned on top of the insulating layer 352. When the insulating layer 352 is fully etched in the plasma etching process and hence the active layer 340 are exposed, an etching process is performed on the active layer 340 for a certain amount of time to make the active layer 340 conductive. That is, once plasma etching is performed on the active layer 340, oxygen atoms are released out of the active layer 340 and instead an impurity is injected into the active layer 340, thereby improving the conduction characteristics. Accordingly, a channel region CH in the active layer 340 is formed to correspond to where the gate electrode 360 and the gate insulating film 350 are positioned, and a conductive region CP is formed to correspond to the remaining part of the active layer 340 except the channel region CH. Accordingly, the gate electrode 360 and the gate insulating film 350 are formed in the channel region CH of the active layer 340 and have a similar size. Afterwards, the photoresist pattern PR is removed by stripping.

Figure 11F:
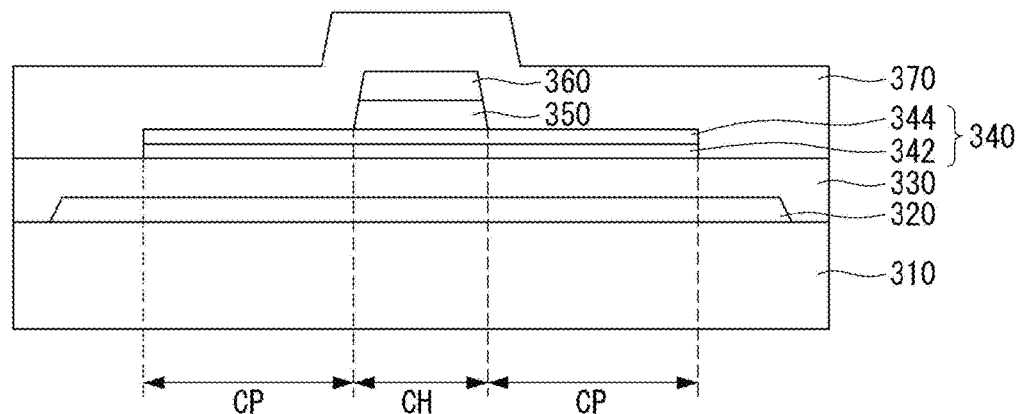
Figure 11G:
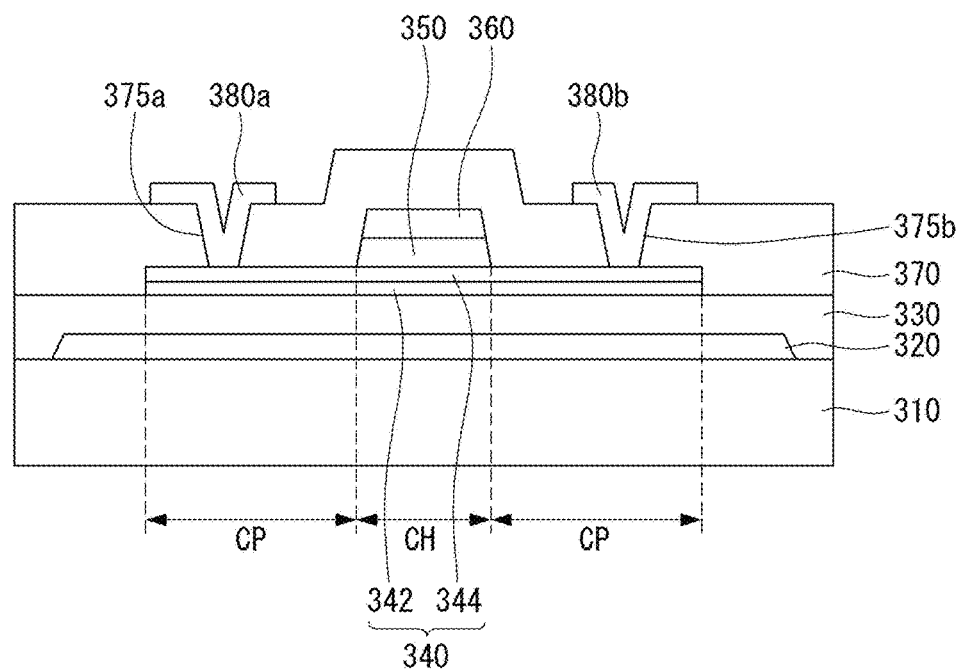

Next, referring to FIG. 11F, an interlayer insulating film 370 is formed by depositing silicon oxide (SiOx) or silicon nitride (SiNx) on the substrate 310 with the gate electrode 360 formed on it by a deposition method such as CVD (chemical vapor deposition), PECVD (plasma enhanced chemical vapor deposition), or sputtering deposition.

Then, contact holes 375a and 375b exposing the conductive region CP on both sides of the active layer 340 are formed by etching the interlayer insulating film 370. Then, a source electrode 380a and a drain electrode 380b are formed by laminating any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements on the substrate 310 and patterning it. The source electrode 380a and the drain electrode 380b are connected to the active layer 340 via the contact holes 375a and 375b formed in the interlayer insulating film 370. As such, a thin-film transistor TFT is formed, which comprises the active layer 340 comprising the underlying active layer 342 and the intermediate layer 344, the gate electrode 360, the source electrode 380a, and the drain electrode 380b.

Figure 11H:
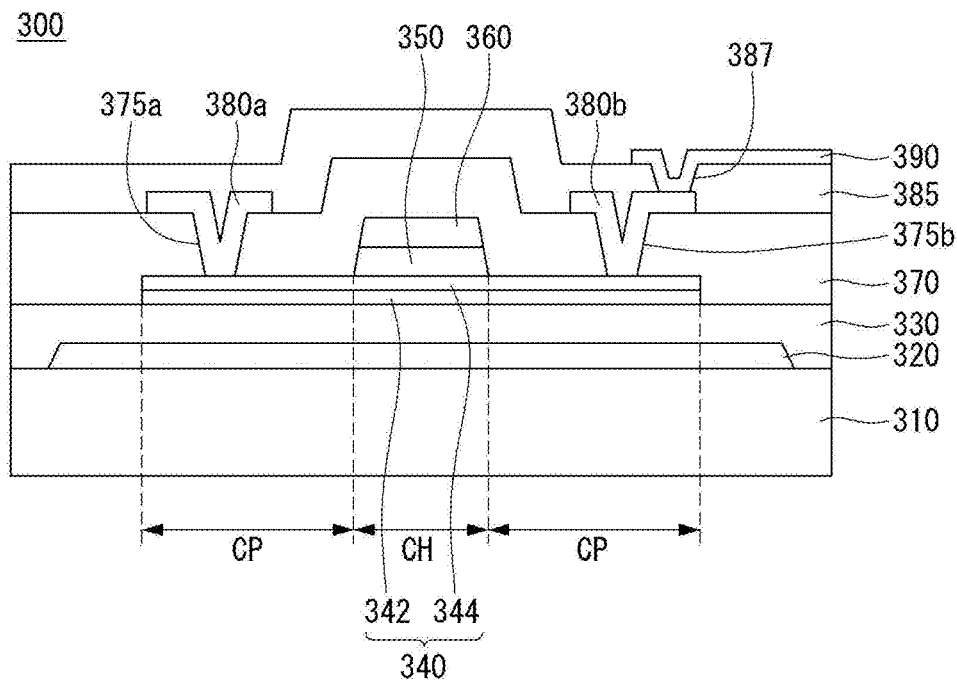

Lastly, referring to FIG. 11H, a passivation film 385 is formed by depositing silicon oxide (SiOx) or silicon nitride (SiNx) on the substrate 310 with the thin-film transistor formed on it by a deposition method such as CVD (chemical vapor deposition), PECVD (plasma enhanced chemical vapor deposition), or sputtering deposition. Then, a via hole 387 exposing part of the drain electrode 385b is formed by etching the passivation film 385. Then, a pixel electrode 390 is formed by laminating ITO, IZO, ITZO, ZnO, etc. on the substrate 310 and patterning it. In this way, a thin-film transistor array substrate according to the third exemplary embodiment of the present invention is manufactured.

FIGS. 12A through 12F are views showing each process of the method of manufacturing a thin-film transistor array substrate according to the fourth exemplary embodiment of the present invention.

Figure 12A:
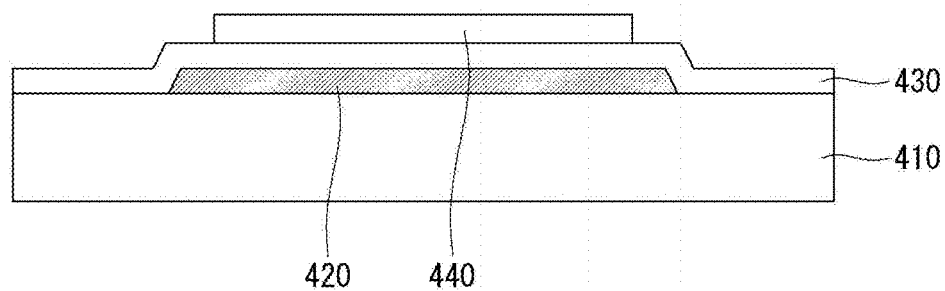
FIGS. 12A through 12F are views showing each process of the method of manufacturing a thin-film transistor array substrate according to the fourth exemplary embodiment of the present invention.

Referring to FIG. 12A, a light blocking film 420 is formed by forming a resin containing a material, such as carbon black, that represents a black color or a semiconductor material, such as amorphous silicon (a-Si), germanium (Ge), tantalum oxide (TaOx), and copper oxide (CuOx), on a substrate 410 made of transparent or opaque glass, plastic, or metal and maintaining its flatness, and then patterning it using a mask. The light blocking film 420 is formed for each area where an active layer is to be formed later. However, the present invention is not limited to this, and the light blocking film 420 may be formed on the entire surface of the substrate 410.

Subsequently, a buffer layer 430 is formed by depositing silicon oxide (SiOx) or silicon nitride (SiNx) on the substrate 410 with the light blocking film 420 formed on it by a deposition method such as CVD (chemical vapor deposition), PECVD (plasma enhanced chemical vapor deposition), or sputtering deposition. Then, an oxide semiconductor layer is laminated on the substrate 410 with the buffer layer 430 formed on it by a sputtering method using a composite target of indium oxide ($In_2O_3$), tin oxide (SnO), and zinc oxide (ZnO). Next, an active layer 440 is formed by patterning the oxide semiconductor layer using a mask. Besides, the active layer 440 may be formed by a chemical vapor deposition method such as chemical vapor deposition or atomic layer deposition (ALD). The active layer 440 is formed to correspond to the light blocking film 420 formed on the substrate 410, so that the light coming from below from is kept from reaching the active layer 440, thereby preventing leakage current due to the light.

Figure 12B:
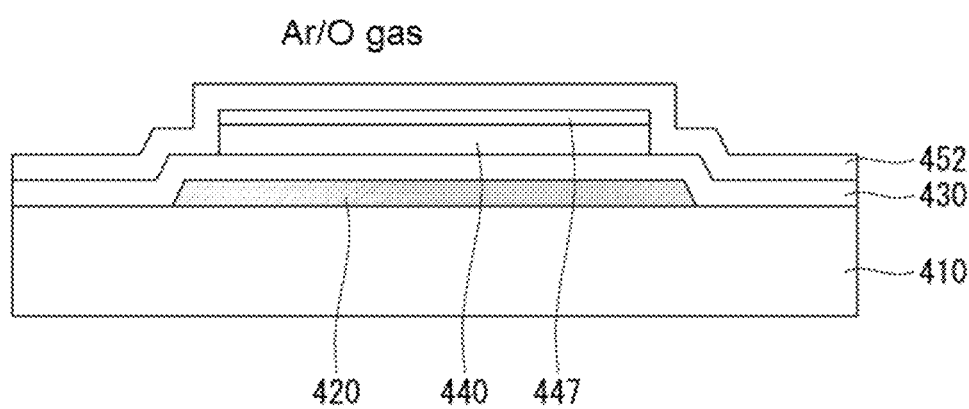

Next, referring to FIG. 12B, an oxide layer 447 and an insulating layer 452 is formed on the substrate 310 with the active layer 440 formed on it by depositing silicon oxide SiOx or silicon nitride SiNx by CVD, PECVD, or sputtering deposition. The oxide layer 447 is formed on the surface of the active layer 440. That is, the oxide layer 447 is formed as materials in the active layer and silicon are mixed together by adjusting argon (Ar) and oxygen (O) gases in the CVD process for forming the insulating layer 452.

Figure 12C:
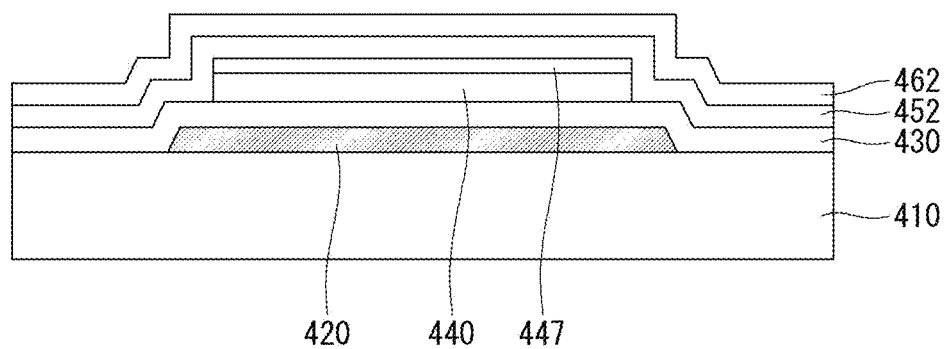

Next, referring to FIG. 12C, a metal layer 462 is formed on the insulating layer 452 by depositing any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements by sputtering deposition.

Figure 12D:
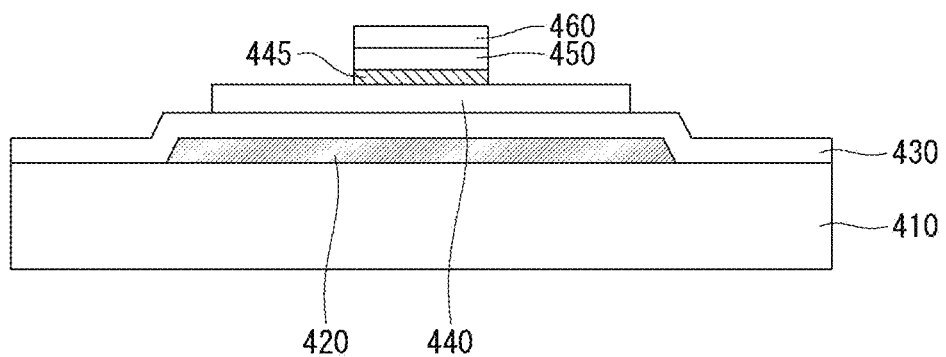

Next, referring to FIG. 12D, a photoresist pattern is formed by applying a photoresist onto the metal layer 462 and exposing it to light and developing it, and then a gate electrode 460 is formed by etching the metal layer 462 using the photoresist pattern as a mask. The metal layer 462 is etched by wet etching using an etching solution for etching the target material.

Figure 12E:
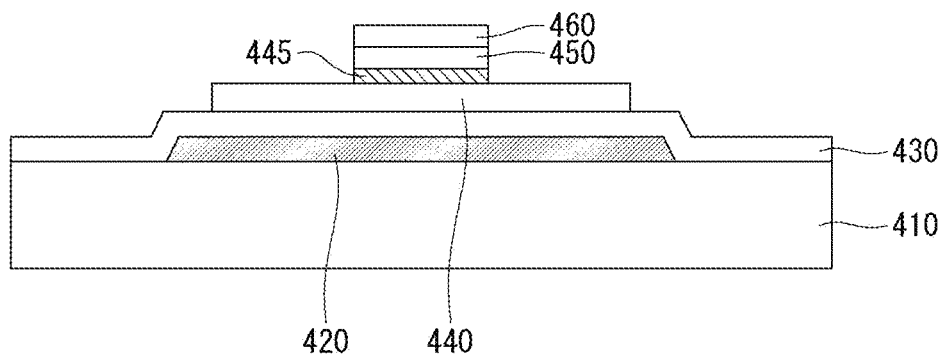

Next, referring to FIG. 12E, a gate insulating film 450 is formed by etching the insulating layer 452 using the gate electrode 460. The insulating layer 452 is etched by a plasma etching process using a gas such as argon (Ar), and has a similar size to the gate electrode 460 positioned on top of the insulating layer 452. When the insulating layer 452 is fully etched in the plasma etching process and hence the oxide layer 447 and the active layer 440 are exposed, an etching process is performed on the oxide layer 447 and the active layer 440 for a certain amount of time to make the active layer 440 conductive. That is, once plasma etching is performed on the active layer 440, oxygen atoms are released out of the active layer 440 and instead an impurity is injected into the active layer 440, thereby improving the conduction characteristics. Accordingly, a channel region CH in the active layer 440 is formed to correspond to where the gate electrode 460 and the gate insulating film 450 are positioned, and a conductive region CP is formed to correspond to the remaining part of the active layer 440 except the channel region CH. Then, an intermediate layer 445 is formed by etching the oxide layer 447 exposed by the gate insulating film 450. Accordingly, the gate electrode 460, gate insulating film 450, and intermediate layer 445 are formed in the channel region CH of the active layer 440 and have a similar size.

Figure 12F:
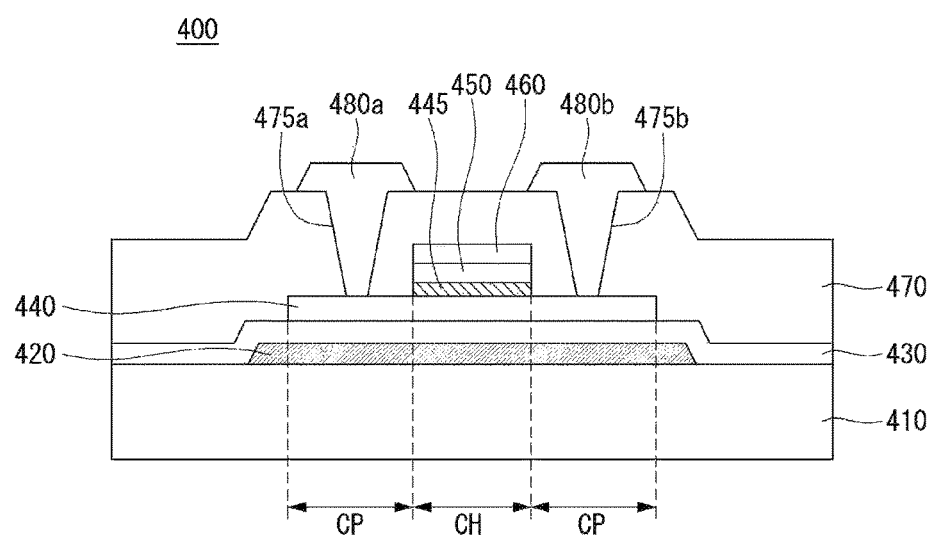

Next, referring to FIG. 12F, an interlayer insulating film 470 is formed by depositing silicon oxide (SiOx) or silicon nitride (SiNx) on the substrate 410 with the gate electrode 460 formed on it by a deposition method such as CVD (chemical vapor deposition), PECVD (plasma enhanced chemical vapor deposition), or sputtering deposition. Then, contact holes 475a and 475b exposing the conductive region CP on both sides of the active layer 440 are formed by etching the interlayer insulating film 470. Then, a source electrode 480a and a drain electrode 480b are formed by laminating any one selected from the group consisting of copper (Cu), molybdenum (Mo), aluminum (Al), chrome (Cr), gold (Au), titanium (Ti), nickel (Ni), neodymium (Nd), tantalum (Ta), and tungsten (W) or an alloy of these elements on the substrate 410 and patterning it. The source electrode 480a and the drain electrode 480b are connected to the active layer 440 via the contact holes 475a and 475b formed in the interlayer insulating film 470. As such, a thin-film transistor TFT is formed, which comprises the active layer 440, the intermediate layer 445, the gate electrode 460, the source electrode 480a, and the drain electrode 480b.

Figure 13:
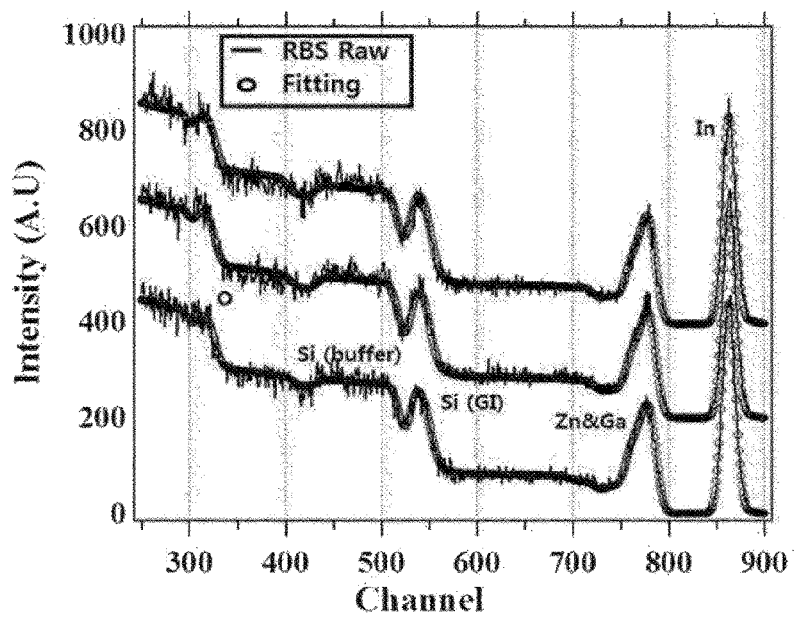
FIG. 13 is a graph showing the results of Rutherford backscattering spectrometry on the thin-film transistor array substrate manufactured according to the first exemplary embodiment of the present invention.
Figure 14:
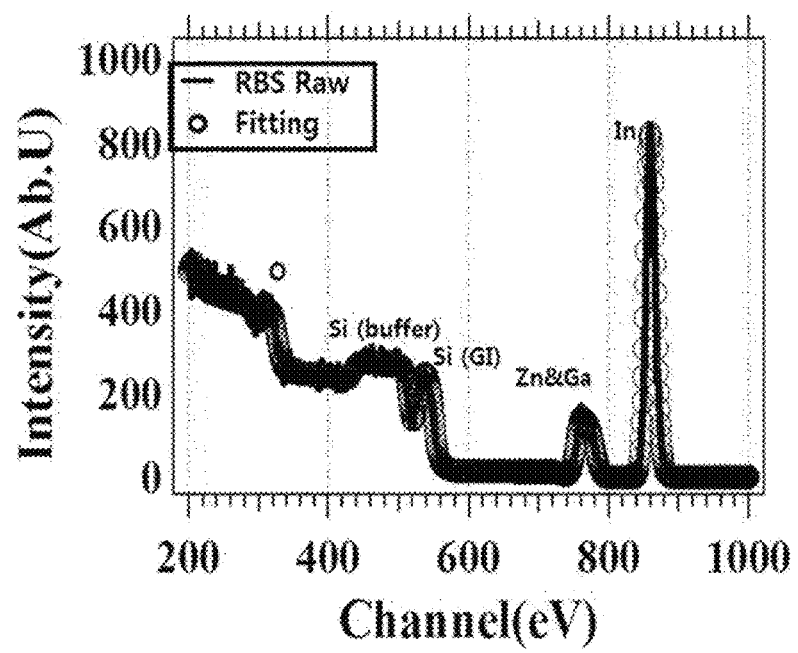
FIG. 14 is a graph showing the results of Rutherford backscattering spectrometry on the thin-film transistor array substrate manufactured according to the third exemplary embodiment of the present invention.

FIG. 13 is a graph showing the results of Rutherford backscattering spectrometry on the thin-film transistor array substrate manufactured according to the first exemplary embodiment of the present invention. FIG. 14 is a graph showing the results of Rutherford backscattering spectrometry on the thin-film transistor array substrate manufactured according to the third exemplary embodiment of the present invention.

Referring to FIG. 13, the results of analysis of the laminated structure of the active layer, intermediate layer, and gate insulating film by Rutherford backscattering spectrometry (RBS) showed that all of them contain the Group IV element, silicon (Si). Referring to FIG. 14, the results of analysis of the laminated structure of the active layer comprising the underlying active layer and the intermediate layer and the gate insulating film by Rutherford backscattering spectrometry (RBS) also showed that all of them contain the Group IV element, silicon (Si). This means that atoms of this group IV element are bound by strong covalent bonds, thus reducing the amount of unbound metal atoms and making this structure thermally stable. Accordingly, atomic diffusion that may occur in the subsequent processes may be avoided. Especially, the atomic percent of silicon in each of these layers may be around 50 to 200% of the atomic percent of zinc in the layer.

Hereinafter, thin-film transistors according to the present invention will be described in detail in the following exemplary embodiments. However, the exemplary embodiments disclosed below are only examples of present invention and the present invention is not limited to the following exemplary embodiments.

Test 1: Coplanar Thin-Film Transistor

Comparative Example 1

A buffer layer of $SiO_2$ was formed on a glass substrate, an active layer with an atomic ratio of $In_1Ga_1Zn_1O_4$ was formed on the buffer layer, and a gate insulating film of $SiO_2$ was formed on the active layer. A gate electrode of molybdenum was formed on the gate insulating film, an interlayer insulating film of $SiO_2$ was formed, and then source and drain electrodes of aluminum were formed, thereby preparing a thin-film transistor.

Comparative Example 2

A thin-film transistor was manufactured under the same condition as the above Comparative Example 1, except that an intermediate layer with an atomic ratio of $In_{1.3}Ga_1Zn_1Si_{0.4}O_5$ and a thickness of 30 Å was formed between the active layer and the gate insulating film by sputtering.

Comparative Example 3

A thin-film transistor was manufactured under the same condition as the above Comparative Example 1, except that an intermediate layer with an atomic ratio of $In_{0.9}Ga_1Zn_1Si_{2.5}O_9$ and a thickness of 90 Å was formed between the active layer and the gate insulating film by sputtering.

Embodiment 1

A thin-film transistor was manufactured under the same condition as the above Comparative Example 1, except that an intermediate layer with an atomic ratio of $In_{1.1}Ga_1Zn_1Si_{0.9}O_{7.8}$ and a thickness of 60 Å was formed between the active layer and the gate insulating film by sputtering.

Figure 15:
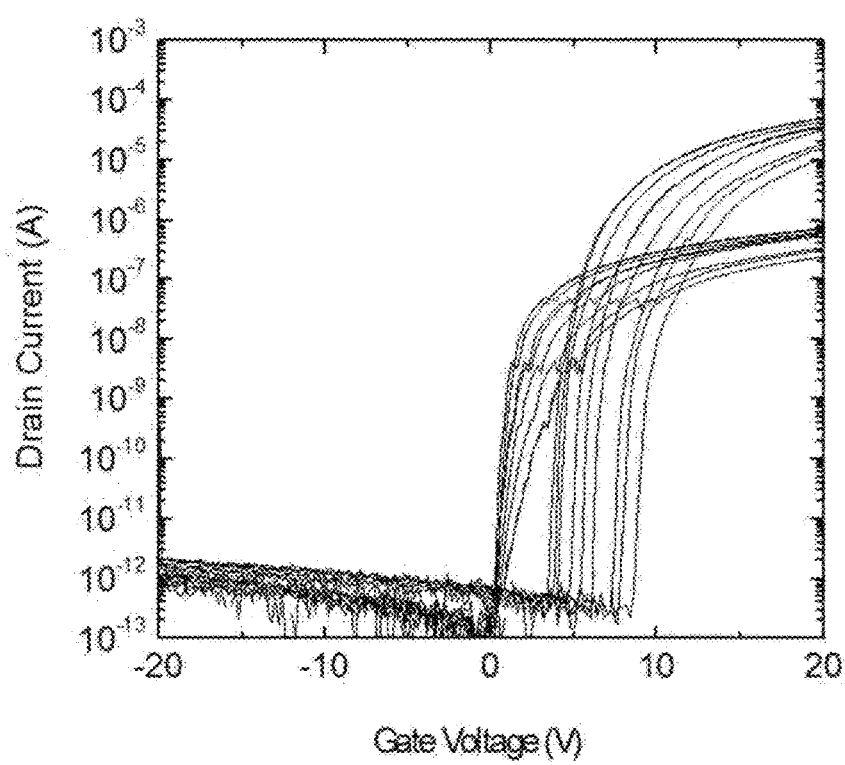
FIG. 15 is a graph of the drain current vs. gate-source voltage of the thin film transistor according to Comparative Example 1.
Figure 16:
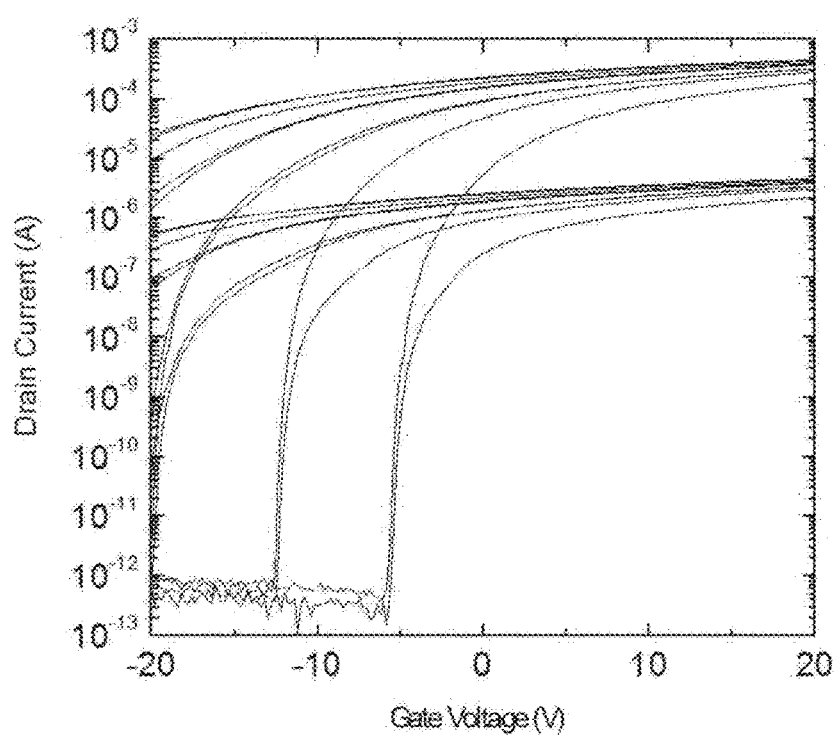
FIG. 16 is a graph of the drain current vs. gate-source voltage of the thin film transistor according to Comparative Example 2.

The drain current versus gate-source voltage of the thin-film transistors manufactured according to the above Comparative Examples 1, 2, and 3 and Embodiment 1 was measured and shown in FIGS. 15 through 18. FIG. 15 is a graph of the drain current vs. gate-source voltage of the thin film transistor according to Comparative Example 1. FIG. 16 is a graph of the drain current vs. gate-source voltage of the thin film transistor according to Comparative Example 2.

Figure 17:
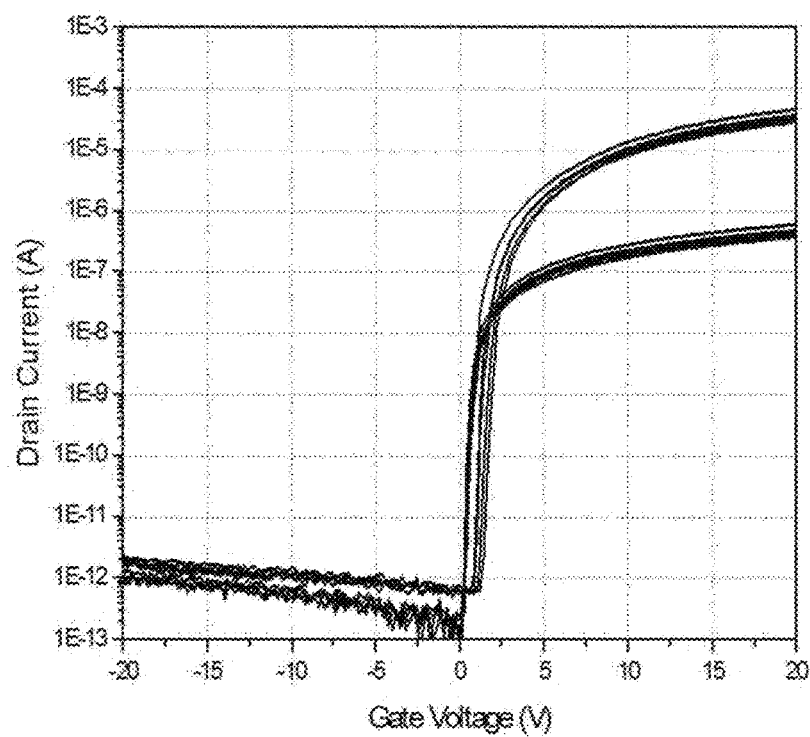
FIG. 17 is a graph of the drain current vs. gate-source voltage of the thin film transistor according to Comparative Example 3.
Figure 18:
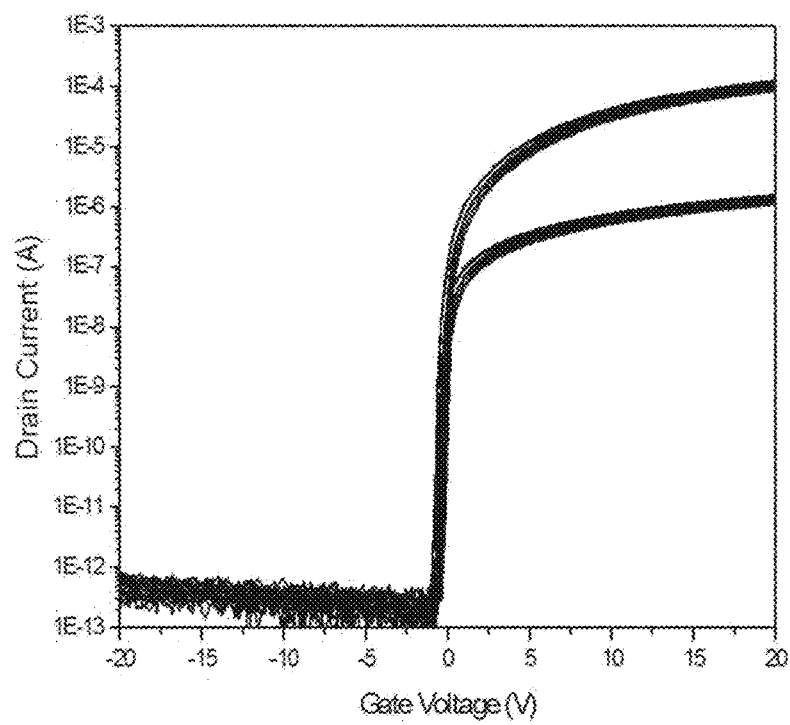
FIG. 18 is a graph of the drain current vs. gate-source voltage of the thin film transistor according to Embodiment 1.

FIG. 17 is a graph of the drain current vs. gate-source voltage of the thin film transistor according to Comparative Example 3. FIG. 18 is a graph of the drain current vs. gate-source voltage of the thin film transistor according to Embodiment 1. Also, the threshold voltage, slope(subthreshold slope), and carrier mobility of the thin-film transistors according to the above Comparative Example 1 and Embodiment 1 were measured and shown in the following Table 2.

TABLE 2

|  | Comparative Example 1 | Embodiment 1 |
|---|---|---|
| Threshold voltage (V) | 4.2 | 0.07 |
| Slope (V/dec) | 0.21 | 0.11 |
| Carrier mobility (cm²/Vs) | 4.4 | 10 |

Referring to FIG. 15, in Comparative Example 1 in which no intermediate layer was present, the gate-source voltage shifted to positive, the threshold voltage was 4.2 V, the slope was 0.21, and the carrier mobility was 4.4 cm$^2$/Vs. Referring to FIG. 16, in Comparative Example 2 in which an intermediate layer with an atomic ratio of $In_{1.3}Ga_1Zn_1Si_{0.4}O_5$ and a thickness of 30 Å was formed, the gate-source voltage shifted to negative. Referring to FIG. 17, it can be seen that, in Comparative Example 3 in which an intermediate layer with an atomic ratio of $In_{0.9}Ga_1Zn_1Si_{2.5}O_9$ and a thickness of 90 Å was formed, it can be seen that the device's channel layer was uneven because, when the device was driven, a phenomenon that the current-voltage curves are crossed is terribly occurred at operating voltages between 0.1 V and 10 V. On the contrary, referring to Table 2 and FIG. 18, in Embodiment 1 in which an intermediate layer with an atomic ratio of $In_{1.1}Ga_1Zn_1Si_{0.9}O_{7.8}$ and a thickness of 60 Å was formed, the threshold voltage was −0.07 V, the carrier mobility was 10 cm$^2$/Vs, and the slope was 0.11. In conclusion, the characteristics of the thin-film transistor were drastically improved.

Test 2: Etch-Stopper Thin-Film Transistor

Comparative Example 4

A gate electrode of molybdenum was formed on a glass substrate, and a gate insulating film of $SiO_2$ was formed. Then, an active layer with an atomic ratio of $In_1Ga_1Zn_1O_t$ was formed, and an etch stopper of $SiO_2$ was formed on the active layer. Next, source and drain electrodes of aluminum were formed, thereby manufacturing a thin-film transistor.

Embodiment 2

A thin-film transistor was manufactured under the same condition as the above Comparative Example 4, except that an intermediate layer with an atomic ratio of $In_{1.1}Ga_1Zn_1Si_{0.9}O_{7.8}$ and a thickness of 60 Å was formed between the active layer and the gate insulating film by sputtering.

Figure 19:
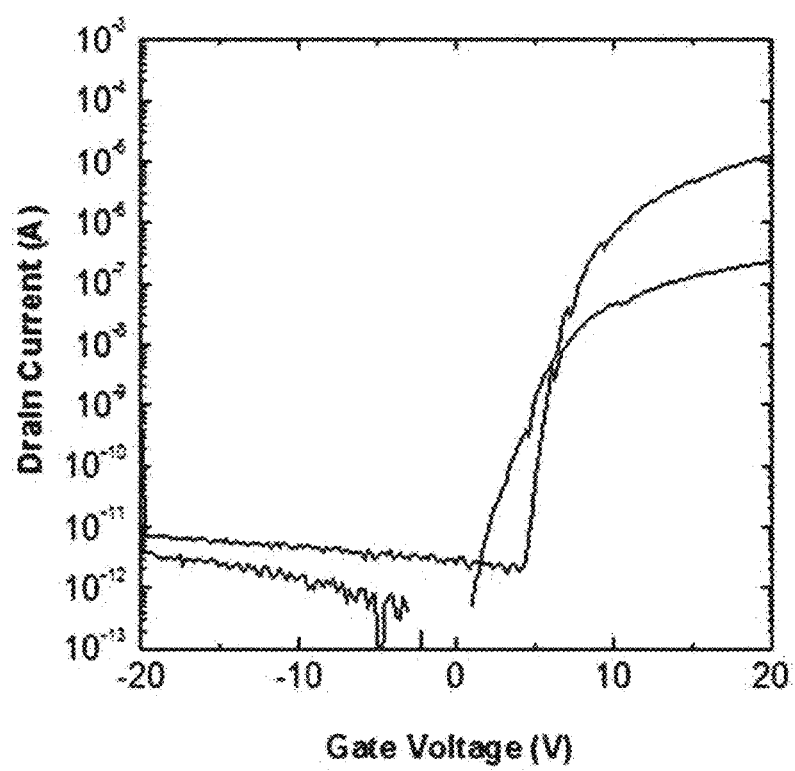
FIG. 19 is a graph of the drain current vs. gate-source voltage of the thin film transistor according to Comparative Example 4.
Figure 20:
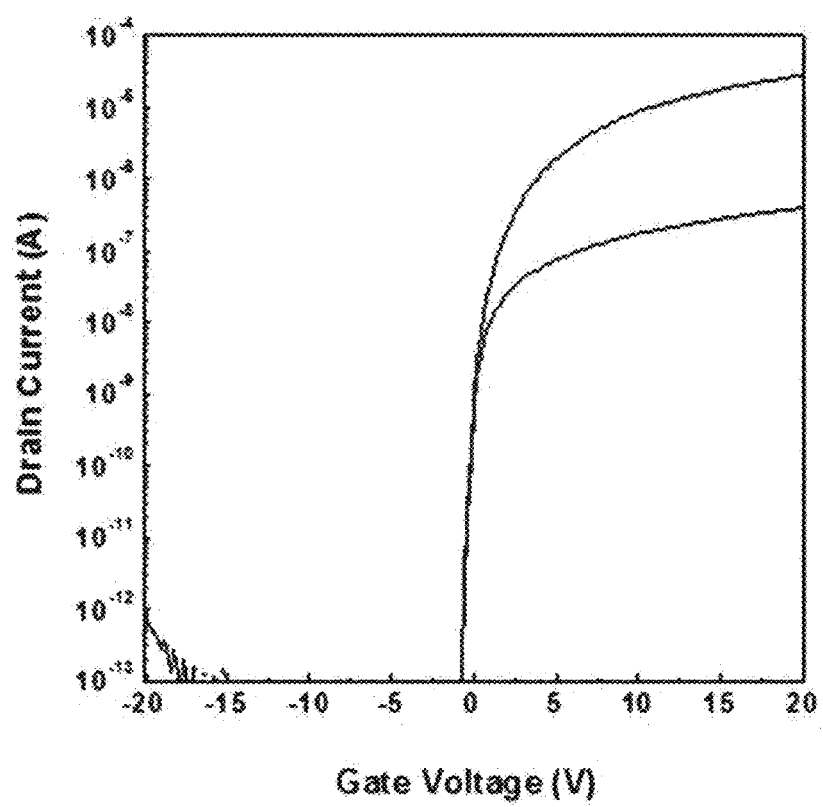
FIG. 20 is a graph of the drain current vs. gate-source voltage of the thin film transistor according to Embodiment 2.

The drain current versus gate-source voltage of the thin-film transistors manufactured according to the above Comparative Example 4 and Embodiment 2 was measured and shown in FIGS. 19 and 20. FIG. 19 is a graph of the drain current vs. gate-source voltage of the thin film transistor according to Comparative Example 4. FIG. 20 is a graph of the drain current vs. gate-source voltage of the thin film transistor according to Embodiment 2. Also, the threshold voltage, slope(subthreshold slope), and carrier mobility of the thin-film transistors according to the above Comparative Example 4 and Embodiment 2 were measured and shown in the following Table 3.

TABLE 3

|  | Comparative Example 4 | Embodiment 2 |
|---|---|---|
| Threshold voltage (V) | 8.19 | 0.6 |
| Slope (V/dec) | 0.39 | 0.3 |
| Carrier mobility (cm²/Vs) | 8.1 | 10.1 |

Referring to FIGS. 19 and 20 and Table 3, in Comparative Example 4 in which no intermediate layer was present, the threshold voltage was 8.19 V, the slope was 0.39, and the carrier mobility was 8.1 cm$^2$/Vs. On the contrary, in Embodiment 2 in which an intermediate layer with an atomic ratio of $In_{1.1}Ga_1Zn_1Si_{0.9}O_{7.8}$ and a thickness of 60 Å was formed, the threshold voltage was −0.6 V, the carrier mobility was 10.1 cm$^2$/Vs, and the slope was 0.3. In conclusion, the characteristics of the thin-film transistor were drastically improved.

Test 3: Thin-Film Transistor with Two-layered Active Layer

Comparative Example 5

A buffer layer of $SiO_2$ was formed on a glass substrate, an active layer was formed by forming a underlying active layer with an atomic ratio of $In_4Ga_1Zn_3O_{16.5}$ and a thickness of 240 Å on the buffer layer and an intermediate layer with an atomic ratio of $Si_{10}In_5Ga_1Zn_1O_{35}$ and a thickness of 40 Å on the underlying active layer. A gate insulating film of $SiO_2$ was formed on the active layer, a gate electrode of molybdenum was formed on the gate insulating film, an interlayer insulating film of $SiO_2$ was formed, and then source and drain electrodes of aluminum were formed, thereby manufacturing a thin-film transistor.

Comparative Example 6

A thin-film transistor was manufactured under the same condition as the above Comparative Example 5, except that an active layer was formed with an intermediate layer with an atomic ratio of $Si_{15}In_5Ga_1Zn_1O_{35}$ and a thickness of 120 Å.

Embodiment 3

A thin-film transistor was manufactured under the same condition as the above Comparative Example 5, except that an active layer was formed with an intermediate layer with an atomic ratio of $Si_{12.5}In_5Ga_1Zn_1O_{35}$ and a thickness of 70 Å.

Figure 21:
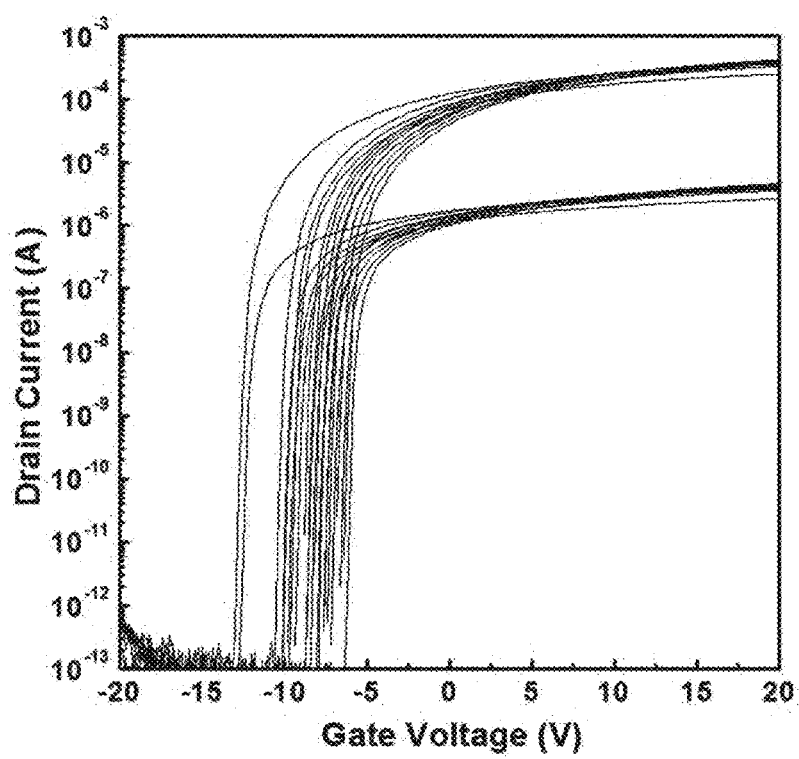
FIG. 21 is a graph of the drain current vs. gate-source voltage of the thin film transistor according to Comparative Example 5.
Figure 22:
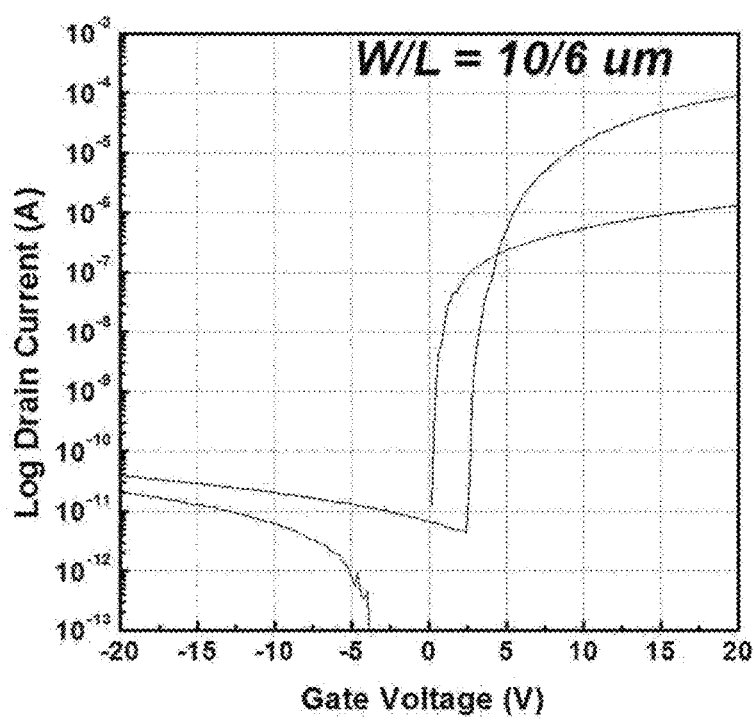
FIG. 22 is a graph of the drain current vs. gate-source voltage of the thin film transistor according to Comparative Example 6.
Figure 23:
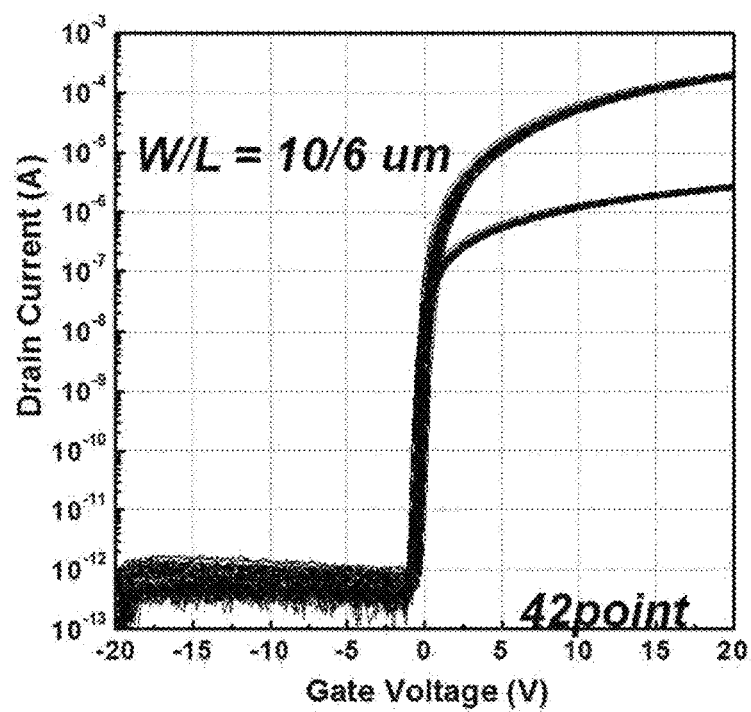
Figure 24:
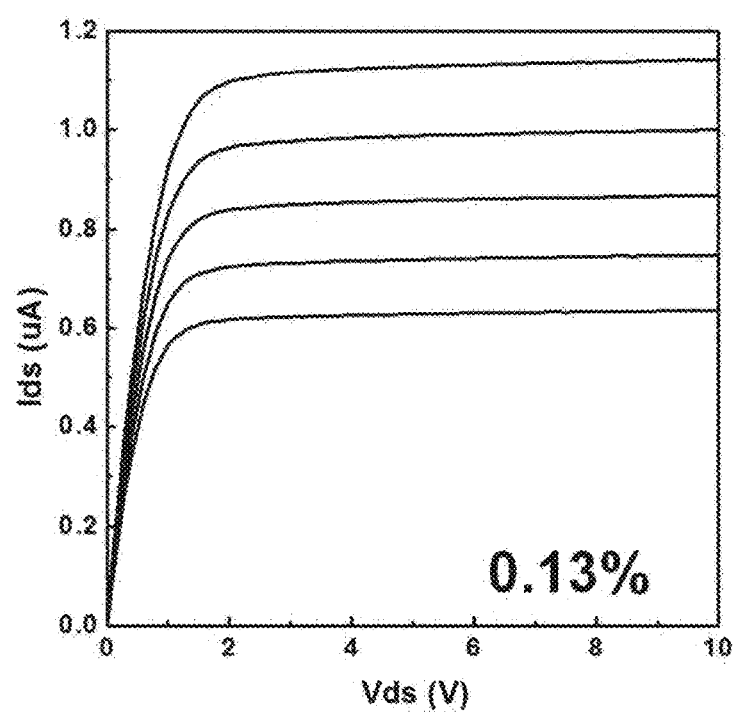
FIG. 24 is a graph of the current change rate of the thin-film transistor according to Embodiment 3 of the present invention.

The drain current versus gate-source voltage of the thin-film transistors manufactured according to the above Comparative Examples 5 and 6 and Embodiment 3 was measured and shown in FIGS. 21 through 23. FIG. 21 is a graph of the drain current vs. gate-source voltage of the thin film transistor according to Comparative Example 5. FIG. 22 is a graph of the drain current vs. gate-source voltage of the thin film transistor according to Comparative Example 6. FIG. 23 is a graph of the drain current vs. gate-source voltage of the thin film transistor according to Embodiment 3. Also, the threshold voltage, current change rate, carrier mobility, positive bias temperature stress (PBTS), current stress (CS), and negative bias temperature stress (NBTS) of the thin-film transistor according to the above Embodiment 3 were measured and shown in the following Table 4, and the current change rate measurements were illustrated in FIG. 24.

TABLE 4

|  | Embodiment 3 |
|---|---|
| Threshold voltage (V) | −0.1 |
| Current change rate (@ 860 nA) | 0.13% |
| Carrier mobility (cm²/Vs) | 28.4 |
| PBTS (ΔVth) | 0.8 |
| CS (ΔVgs) | 0.1 |
| NBTS (ΔVth) | −0.04 |

Referring to FIG. 21, in Comparative Example 5 in which the intermediate layer with an atomic ratio of $Si_{10}In_5Ga_1Zn_1O_{35}$ and a thickness of 40 Å was formed, the gate-source voltage distribution is bigger and this resulted in severe irregularities on the device. Also, referring to FIG. 22, in Comparative Example 6 in which the intermediate layer with an atomic ratio of $Si_{15}In_5Ga_1Zn_1O_{35}$ and a thickness of 120 Å was formed, gate electrode was not control due to too many carriers. On the contrary, referring to Table 4 and FIGS. 23 and 24, in Embodiment 3 in which the intermediate layer with an atomic ratio of $Si_{12.5}In_5Ga_1Zn_1O_{35}$ and a thickness of 70 Å was formed, the threshold voltage was −0.1 V, the current change rate was 0.13%, the carrier mobility was 28.4 cm²/Vs, the PBTS was 0.8 V, the NBTS was −0.04 V, and the CS was 0.1 V. Thus, it can be concluded that the characteristics of the thin-film transistor were excellent.

Test 4: Variations of Coplanar Thin-Film Transistor with Composition and Thickness of Intermediate Layer Embodiment 4

A buffer layer of $SiO_2$ was formed on a glass substrate, an active layer with an atomic ratio of $In_4Ga_1Zn_3O_{16.5}$ and a thickness of 240 Å was formed on the buffer layer, and an intermediate layer with a thickness of 50 Å was formed on the active layer. A gate insulating film of $SiO_2$ was formed on the intermediate layer, a gate electrode of molybdenum was formed on the gate insulating film, an interlayer insulating film of $SiO_2$ was formed, and then source and drain electrodes of aluminum were formed, thereby manufacturing a thin-film transistor.

Comparative Example 7

A thin-film transistor was manufactured under the same condition as the above Embodiment 4, but without an intermediate layer.

Figure 25:
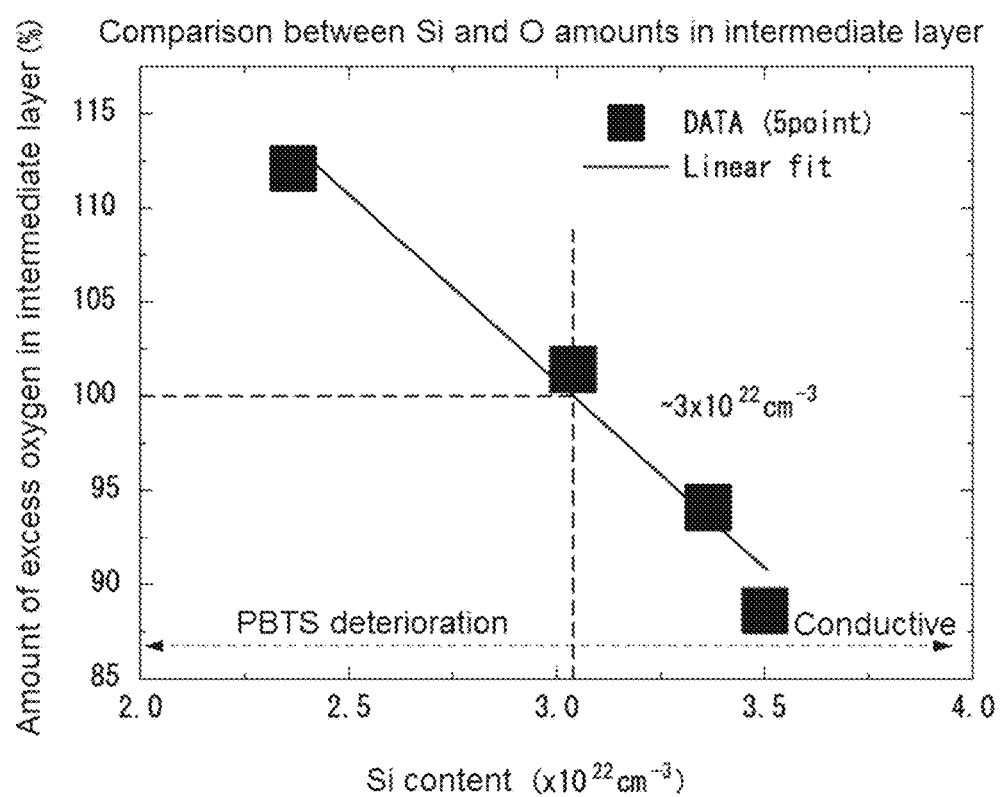
FIG. 25 is a graph of the measurements of the amount of excess oxygen in the intermediate layer relative to the silicon content in the intermediate layer, in the thin-film transistor manufactured according to Embodiment 4.
Figure 26:
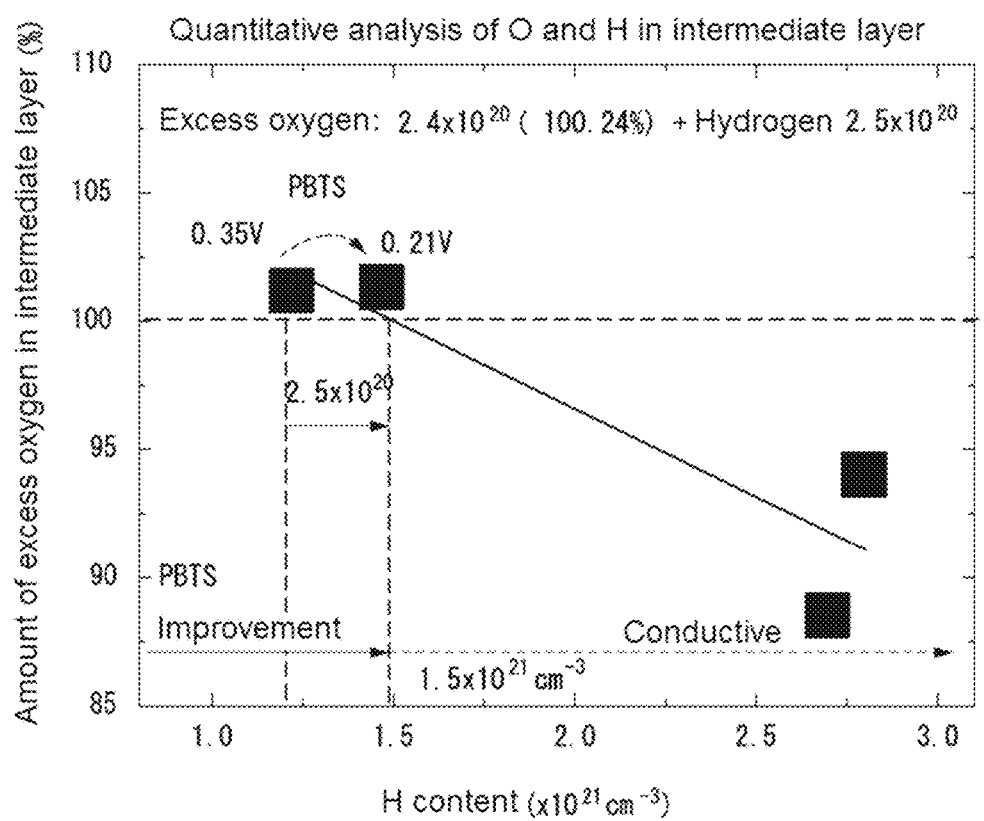
FIG. 26 is a graph of the measurements of the amount of excess oxygen in the intermediate layer relative to the hydrogen content in the intermediate layer and the resulting positive bias temperature stress measurements, in the thin-film transistor manufactured according to Embodiment 4.
Figure 27:
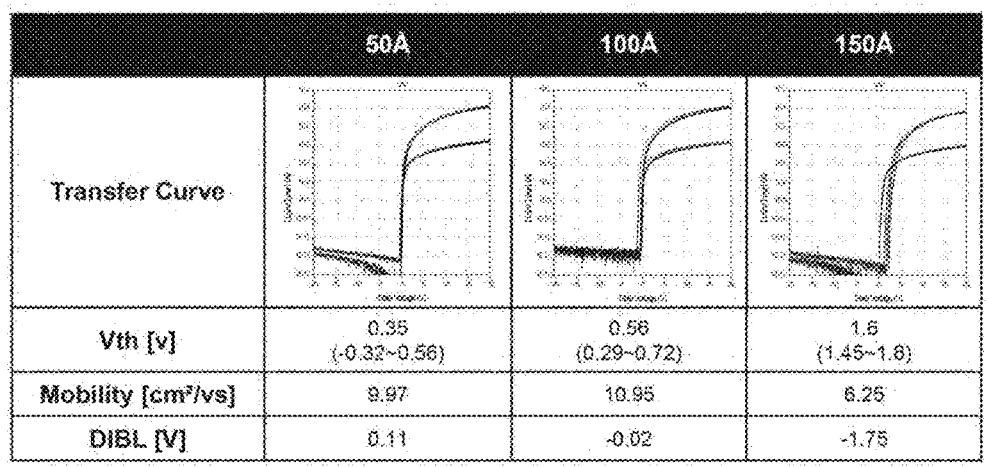
FIG. 27 is a graph of the measurements of the threshold voltage, carrier mobility, and DIBL (drain-induced barrier lowering) in varying thicknesses of 50 Å, 100 Å, and 150 Å of the intermediate layer, in the thin-film transistor manufactured according to Embodiment 4.

In the thin-film transistor manufactured according to Embodiment 4, the amount of excess oxygen in the intermediate layer relative to the silicon content in the intermediate layer was measured and shown in FIG. 25, and the amount of excess oxygen in the intermediate layer relative to the hydrogen content in the intermediate layer was measured and the resulting positive bias temperature stress was measured and shown in FIG. 26, and the threshold voltage, carrier mobility, and DIBL (drain-induced barrier lowering) were measured in varying thicknesses of 50 Å, 100 Å, and 150 Å of the intermediate layer and shown in FIG. 27. Also, the positive bias temperature stress of the thin-film transistors manufactured according to the above Embodiment 4 and Comparative Example 7 was shown in FIG. 28.

Referring to FIG. 25, when the silicon content in the intermediate layer is between $2.9 \times 10^{22}$ cm$^{-3}$ and $3.2 \times 10^{22}$ cm$^{-3}$, the amount of excess oxygen in the intermediate layer is close to about 100%. If the silicon content in the intermediate layer decreases, the amount of excess oxygen increases and this leads to positive bias temperature stress, and if the silicon content in the intermediate layer increases, the amount of excess oxygen decreases and this makes the device conductive. From these results, it can be seen that, when the silicon content in the intermediate layer is between $2.9 \times 10^{22}$ cm$^{-3}$ and $3.2 \times 10^{22}$ cm$^{-3}$, positive bias temperature stress may be prevented and the device may be prevented from becoming conductive.

Referring to FIG. 26, when the percent of excess oxygen in the intermediate layer is 100.24% and the amount of excess oxygen is $2.4 \times 10^{20}$ cm$^{-3}$, $2.5 \times 10^{20}$ cm$^{-3}$ of hydrogen corresponding to the amount of excess oxygen was added. It was observed that there was no change in the amount of excess oxygen in the intermediate layer and the positive bias temperature stress decreased by around 0.14 V, from 0.35 V to 0.21 V. From these results, it can be seen that the positive bias temperature stress may be improved, even if there is no change in the amount of excess oxygen, by adding as many hydrogen atoms as excess oxygen in the intermediate layer.

Referring to FIG. 27, when the thickness of the intermediate layer was 50 Å, the threshold voltage was 0.35 V, the carrier mobility was 9.97 cm²/Vs, and the DIBL was 0.11 V, and when the thickness of the intermediate layer was 100 Å, the threshold voltage was 0.56 V, the carrier mobility was 10.95 cm²/Vs, and the DIBL was 0.02 V. When the thickness of the intermediate layer was 150 Å, the threshold voltage was 1.6 V, the carrier mobility was 6.25 cm²/Vs, and the DIBL was −1.75 V. From these results, it can be seen that, when the intermediate layer has a thickness greater than 100 Å, the threshold voltage may increase and the carrier mobility and the DIBL may decrease.

Figure 28:
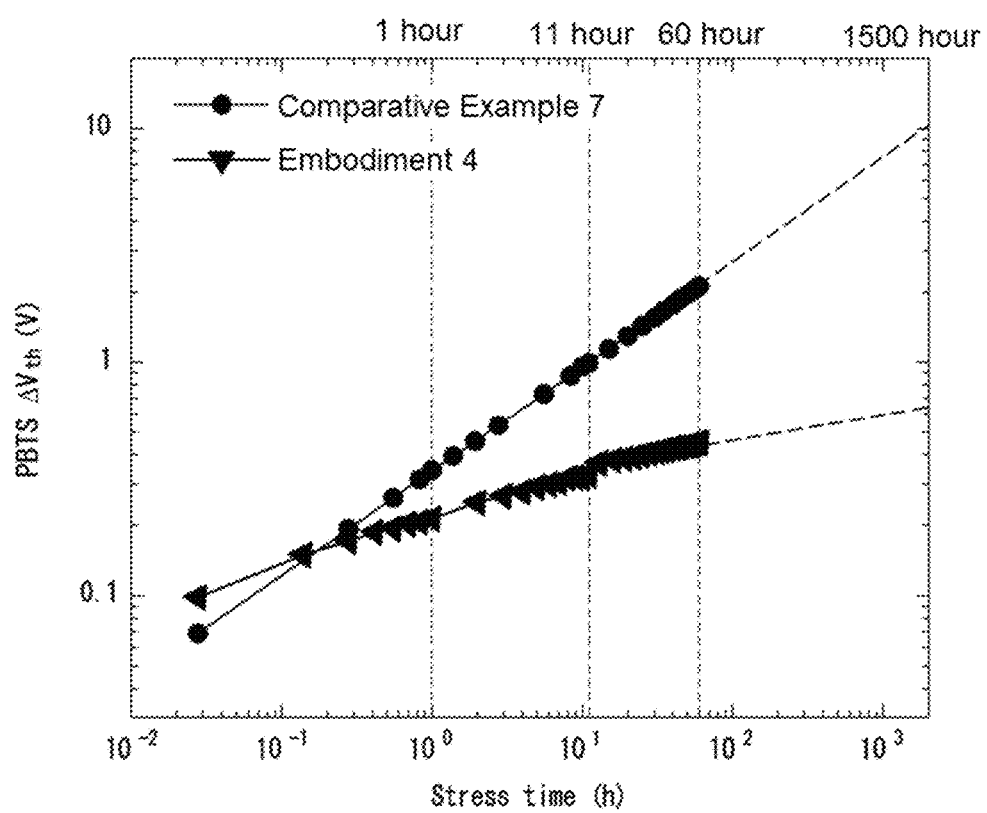
FIG. 28 is a graph of the measurements of the positive bias temperature stress of the thin-film transistors manufactured according to Embodiment 4 and Comparative Example 7.

Referring to FIG. 28, the thin-film transistor according to Comparative Example 7 showed a large increase in positive bias temperature stress as the stress time increases, whereas the thin-film transistor according to Embodiment 4 showed a much smaller increase in positive bias temperature stress than in Comparative Example 7. From these results, it can be seen that a thin-film transistor with an intermediate layer according to the present invention may reduce positive bias temperature stress and therefore improve device reliability.

As discussed above, the present invention offers the advantage of preventing the hydrogen and oxygen elements in the gate insulating film from diffusing into the active layer during thermal treatment by comprising an intermediate layer comprising a Group IV element between the gate insulating film and the active layer, thereby preventing device deterioration.

Moreover, the present invention can prevent positive bias temperature stress caused by excess oxygen by forming an intermediate layer comprising silicon between the active layer and the gate insulating film. Furthermore, the present invention can prevent excess oxygen from capturing electrons by adding as many hydrogen atoms as excess oxygen remaining in the intermediate layer, thereby preventing positive bias temperature stress.

While the exemplary embodiments of the present disclosure have been described with reference to the accompanying drawings, it can be understood by those skilled in the art that the present disclosure may be implemented as other specific forms without changing the technical spirit and essential characteristics. Accordingly, it should be understood that the exemplary embodiments described above are illustrative and not restrictive in terms of all aspects, the scope of the present disclosure and the description are defined by the appended claims, and it should be interpreted that the meanings and scope of the claims, and all changed or modified forms that derived from equivalent concepts of the claims are included in the scope of the present disclosure.

INDUSTRIAL APPLICABILITY

The present invention may be adapted for various types of displays including organic light emitting displays, liquid crystal displays, electrophoretic displays, inorganic light emitting displays, etc., and also for TVs, mobile devices, monitors, and smart TVs. However, the present invention is not limited to these displays, and may be adapted for any types of devices that can display images.

What is claimed is:

1. A thin-film transistor array substrate comprising:
a substrate;
an active layer positioned on the substrate;
a gate insulating film positioned on the active layer;
a gate electrode positioned on the gate insulating film;
an interlayer insulating film positioned on the gate electrode;
source and drain electrodes positioned on the interlayer insulating film and connected to the active layer,
wherein an intermediate layer made of an oxide semiconductor comprising a Group IV element is positioned between the active layer and the gate insulating film,
wherein the intermediate layer is disposed on the active layer, and
wherein a sidewall of the intermediate layer, a sidewall of the insulating film and a sidewall of the gate electrode are coplanar.

2. The thin-film transistor array substrate of claim 1, wherein the intermediate layer comprises indium, gallium, and zinc, and further comprises a Group IV element.

3. The thin-film transistor array substrate of claim 2, wherein the intermediate layer has an atomic ratio of $In_{1.1}Ga_1Zn_1Si_{(0.5\sim2)}O_{(7.3\sim8.15)}$.

4. The thin-film transistor array substrate of claim 3, wherein the intermediate layer has a thickness of 40 to 70 Å.

5. The thin-film transistor array substrate of claim 2, wherein the Group IV element is silicon.

6. The thin-film transistor array substrate of claim 5, wherein a content of the silicon ranges between $2.9 \times 10^{22}$ $cm^3$ and $3.2 \times 10^{22}$ $cm^3$.

7. The thin-film transistor array substrate of claim 5, wherein the intermediate layer further comprises hydrogen, and a content of the hydrogen ranges between $1.2 \times 10^{21}$ $cm^{-3}$ and $1.6 \times 10^{21}$ $cm^{-3}$.

8. The thin-film transistor array substrate of claim 5, wherein the intermediate layer has a thickness of 50 to 100 Å.

* * * * *